United States Patent [19]
Kowaki

[11] Patent Number: 5,247,474
[45] Date of Patent: Sep. 21, 1993

[54] COEFFICIENTS SETTING METHOD OF A REVERBERATION UNIT

[75] Inventor: Hiroshi Kowaki, Kobe, Japan

[73] Assignee: Fujitsu Ten Limited, Hyogo, Japan

[21] Appl. No.: 865,201

[22] Filed: Apr. 8, 1992

[30] Foreign Application Priority Data

| Apr. 18, 1991 | [JP] | Japan | 3-086856 |
| Apr. 18, 1991 | [JP] | Japan | 3-086861 |
| Apr. 18, 1991 | [JP] | Japan | 3-086914 |
| Jun. 7, 1991 | [JP] | Japan | 3-136649 |

[51] Int. Cl.[5] ........................... G06G 7/02
[52] U.S. Cl. ........................... 364/825
[58] Field of Search ........... 364/825, 724.19; 333/165–167

[56] References Cited

U.S. PATENT DOCUMENTS

| 2,897,442 | 7/1959 | Wright et al. | 333/166 X |
| 3,307,190 | 2/1967 | Clay, Jr. et al. | 333/166 X |
| 3,691,486 | 9/1972 | Borsuk et al. | 333/166 |
| 3,894,219 | 7/1975 | Weigel | 364/724.17 X |
| 4,293,831 | 10/1981 | Lueder | 333/166 X |
| 4,375,623 | 3/1983 | Franssen | 333/166 X |
| 4,541,068 | 9/1985 | Tower | 333/165 X |
| 4,852,034 | 7/1989 | Takayama | 364/724.01 |
| 5,001,445 | 3/1991 | Horvath et al. | 333/165 X |
| 5,014,232 | 5/1991 | André364 | 724.19/ |

Primary Examiner—Tan V. Mai
Attorney, Agent, or Firm—Oliff & Berridge

[57] ABSTRACT

A coefficients setting method of a plurality of parallel connected comb filters whereby a delay time is set to the delay device provided with each comb filter to flatten reverberation frequency and to remove high frequency in the rear part of reverberation. The multiplying coefficients are set to multipliers provided with each comb filter to obtain the common reverberation time in the rear part of reverberation to improve the quality of reverberation sounds.

4 Claims, 29 Drawing Sheets

Rev = −3×D₁/log₁₀ g₁

FROM UPSIDE 0. 80s (10 TURNS)
1. 60s (20 TURNS)
2. 40s (30 TURNS)
3. 20s (40 TURNS)
4. 00s (50 TURNS)

FROM UPSIDE
0.78 s (18 TURNS)
1.61 s (37 TURNS)
2.40 s (55 TURNS)
3.18 s (73 TURNS)
4.01 s (92 TURNS)

0.78s (18 TURNS)
1.61s (37 TURNS)
2.40s (55 TURNS)
3.18s (73 TURNS)
4.01s (92 TURNS)

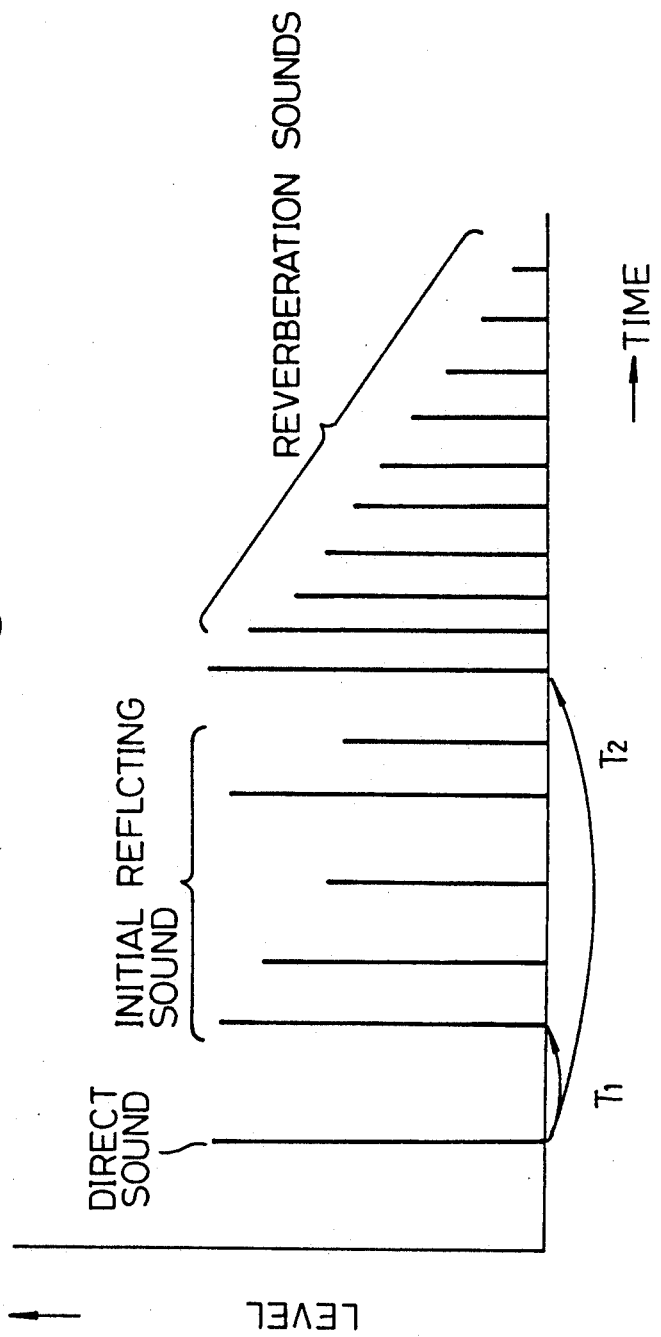

COEFFICIENTS SETTING METHOD OF A REVERBERATION UNIT

BACKGROUND OF THE INVENTION

1. Field of the Invention

The present invention relates to a coefficients setting method of a reverberation unit that artificially adds reverberation sound signals to music signals etc. and realizes the presence and feeling of sound distribution equivalent to an actual concert hall in a room of a home and the interior of a vehicle. Particularly this present invention intends to simplify the setting delay time of comb filters to facilitate operations for forming various kinds of reverberation sounds. Further this present invention intends to set coefficients of the reverberation unit in order to remove unpleasant sounds arising in the rear part of a reverberation in plural stages of comb filters connected in parallel formation and efficiently high frequency components in the rear part of the reverberation sounds.

2. Description of the Related Art

FIG. 25 is a view showing a first prior art reverberation unit. Referring to FIG. 25, a conventional reverberation unit made of DSP(Digital Signal Processor) and realizing the presence and feeling of sound distribution of each venue such as a concert hall, a live house, a church, a stadium etc., comprises an initial delay memory 10 that processes in advance input signals with a given sampling period, an initial reflection delay memory 20 made of a finite impulse response digital filter (FIR) and including a delay memory 20-1 taking in output data from the initial delay memory 10 in turn; multipliers 20-2 adjusting amplitude of the delayed data taken from each tap of the delay memory 20-1, and adders 20-3 adding output data from each of the multipliers 20-2; reverberation device 30 made of an infinite impulse response digital comb filter (IIR) including a delay device 30-1 that delays the output data from the initial delay memory by a predetermined duration; multipliers 30-2 that adjust a gain in the output of the delay device 30-1, and an adder 30-3 that adds the output data of the multipliers 30-2 and the input data of the delay device 30-1 and adder 40 that adds the output data of the reverberation device 30 and said initial reflection delay memory 20.

A sampling frequency normally used is about 48 kHz and an audible frequency about two times the maximum value 20 kHz is adopted as the sampling frequency. In the delay device 30-1, for example, any one of the shift registers, RAM etc. are used. In the case of the shift register the delay data are taken from output taps to set the delay time depending on the selection of the output taps. In the case of RAM, a delay time is set through memory addresses.

FIG. 26 is a view showing an initial reflection sound and a reverberation sound reproduced by a prior reverberation unit. Referring to FIG. 26, a direct sound arrives straight to the listener's seat from a sound source. An initial reflection sound reflected from the ceiling, walls, floor and arriving late at said seat is formed by the initial reflection delay memory 20. After being delayed T2 duration by the initial memory 10, a series of reverberation sounds reflected many times, arrive at said seat randomly from all directions, with differentl delay times and a gradual reduction level pattern, are formed by the reverberation device 3.

FIG. 27 is a view illustrating frequency characteristics of a prior reverberation unit. Referring to FIG. 27, in the case of using, for example RAM as the delay device 30-1 of the reverberation device 30, if a tap of the delay device 30-1 is set as tap=1 to delay a delay time by a sampling period ($Z^{-1}$), an IIR filter indicates a frequency characteristics as shown in this FIG. 27($a$). In this case, if a gain of the multipliers 30-2 is set as a g value, the maximum amplitude value is $1/(1-g)$ at frequencies=0, fs and the minimum amplitude value is $1/(1+g)$ at a frequency=fs/2. As shown in FIG. 28($b$), in the case of setting as tap=2. that is, delaying by two sampling periods ($Z^{-2}$), a standard oscillation peak appears at a frequency fs/2. Further in the case of setting as tap=3, 4, standard oscillation peaks appear at frequencies fs/3, fs/4 respectively. Generally, in the case of setting as fs=D increasingly, as described, standard oscillation peaks appear at every frequency fs/D.

Tap positions of the delay device 30-1 are set depending on the characteristics of the realized concert hall, live house, church, stadium etc.. As shown in FIG. 31, the comb filter 30 has several standard oscillation peaks so that plural stages of comb filters described hereafter, tap positions of which are shifted by a small amount, are provided with the the comb filter 30 to synthesize an output of the comb filter 30 as flat as possible in frequency characteristics.

In the above coefficients setting method of the comb filters 30-1, a problem arises in that the peaks of each stage lump are piled to effect an undesirable auditory feeling. Therefore, in this adjustment, namely in the delay time setting adjustment of each stage comb filter it is necessary to set coefficients at each stage with "cut and try" depending on the auditory feeling or adjust individually the tap positions using FFT(Fast Fourier Transformation). Thus it is difficult to adjust and remove peaks in the auditory feeling of frequency characteristics and very difficult to produce variation of many reverberation sounds. Further, when, for example, the sound field is changed from a concert hall to a live house, a complex coefficient setting method is required to produce and store the adjusted data for a respective unit.

FIG. 28 is a view showing a reverberation unit including 4 stage comb filters. Referring to FIG. 28, a reverberation unit with a plurality of comb filters formed in four stages, will be discussed. First, the reverberation unit includes, as the first~fourth comb filters 30, 31, 32 and 33, delay devices 30-1, 31-1, 32-1 and 33-1, multipliers 30-2, 31-2, 32-3 and 33-2, adders 30-3, 31-3, 32-3 and 33-3, an adder 34 for adding each of the delay devices 30-1, 31-1, 32-1. Tap positions of the first~fourth comb filters 30, 31, 32 and 33 are set depending on the characteristics of the venue, i.e., concert hall, live house, church, stadium etc.

FIG. 29 is a view showing frequency characteristics of comb filter. As shown in FIG. 29, when the tap positions of a comb filter is set, the comb filter has several standard oscillation peaks so that plural stages of comb filters, tap positions of which are shifted by a small amount, are provided with the first~fourth comb filters 30, 31, 32 and 33 to synthesize an output of the comb filter as flat as possible in frequency characteristics.

In the above coefficients setting method of the comb filters 30, 31, 32 and 33, a following problem arises. Here returning to FIG. 29, in the case of forming four stage comb filters to improve such frequency characteristics, each delay time of the delay devices 30-1, 31-1, 32-1, and 33-1 is set as D1, D2, D3 and D4 in relation of D1>D2>D3>D4. For a brief explanation, each multiplying coefficient of multipliers 30-2, 31-2, 32-2, and 33-2 is normally set as g1, g2, g3 and g4 in relation to g1=g2=g3=g4.

FIG. 30 is view showing envelopes of reverberation time of each comb filter. Referring to FIG. 30, as each delay time of the comb filters is small, reduction of the amplitude of the comb filter output is great. Therefore, since the rear part envelope of reverberation amplitude of a comb filter with a small delay time is too small to reduce the density of impulses, a problem arises in that in the rear part of reverberation, a flat frequency characteristic is not accomplished although in the front part of reverberation it is accomplished. Thus in the reproduction of the rear part of reverberation, uncomfortable sounds such as "parapara(tiritiri)" remain. Further, if the above delay time D1–D4 is set at the same time, a coefficients setting method is synthetically easy.

FIG. 31 is a view showing the constitution of a prior second reverberation unit. Refferring to FIG. 31, a comb filter 40 of the reverberation unit includes a first memory 41 for taking in input signals with a given sampling period, a first multiplier 42 for multiplying an output signal that the first delay memory 41 delays by TI duration by a predetermined coefficient and an adder 43 for adding an output of the first multiplier 42 and said input signal.

Further the rear stage of the comb filter 40 includes a second delay memory 44 for taking in the output signal of the first delay memory 41, a second multiplier 45 for multiplying the output signal that the second delay memory 44 delays 1 by sampling period time T2 by a predetermined coefficient g3, a third multiplier 46 for multiplying the output signal of said first memory 1 by a predetermined coefficient and an adder 47 for adding outputs of the second and the third multipliers 5 and 6.

Next, an operation of the comb filter will be discussed hereafter. Similarly, the first delay filter 1, the multiplier 2 and adder 3 includes a kind of finite impulse response filter to reproduce direct sounds, initial reflection sounds, and reverberation sounds containing a live sound in music halls. Similarly the reverberation sounds pass through complex routes in concert halls , arrive late, and provide the presence and feeling of sound distribution with direct sound and the initial reflection sound.

FIG. 32 is a view illustrating reverberation sound characteristics reproduced by the reverberation unit of FIG. 31. The most suitable delay time T1 and the most suitable multiplying coefficient g1 is set for various music concerts. As shown in this Figure, when a signal inputs at time 0, in the first delay memory 41, time T1 output with reduction rate g1 set as the multiplying coefficient, appear.

Next, the second delay memory 44, the second and the third multipliers 5 and 6, and the second adder 7 is formed in a 2 element filter and includes a low pass filter function when multiplying coefficients g2 and g3 are suitably set respectively. When the reverberation includes high frequency components that are needed in initial sound field creation, in the rear part of the reverberation, the high frequency components are normally extinguished as it is undesirable to retain them. Therefore said rear stage low pass filter is provided with the comb filter 40.

In the above reverberation unit of the prior art, however, a problem arises in that said low pass filter enables the removal of the high frequency components occurring because of the rear part of the reverberation and also because of the initial part of the reverberation. Therefore if the low pass filter is constituted to remove the high frequency components only in the rear part of the reverberation, depending on the creating time of the reverberation created in the initial part thereof, a problem arises in that the constitution is large scale and control is complicated.

SUMMARY OF THE INVENTION

An object of the invention is to resolve the above-mentioned problems by setting delay times and multiplying coefficients with a simple construction to make the frequency characteristics in the rear part of reverberation flat and remove high frequency components in the rear part with a simple construction.

FIGS. 1 is a view showing the first principle constitution according to the invention. Referring to FIG. 1, with this object in view, the essence of the present invention resides in a coefficient setting method of a plurality of parallel connected comb filters, comprising the step of setting a delay time of the kth delay device provided with said n comb filters as $T_k = T1/2(k-1)/n$ and arranging frequencies of which standard oscillation peaks of each comb filter occur, at uniform intervals on a logarithmic axis.

With the above coefficients setting method of a plurality of parallel connected comb filters, the delay times for each delay device provided with each comb filter is given by the above equation so that the setting of the coefficients may be easy. And the frequencies of which the standard oscillation peaks occur are arranged at uniform intervals on an logarithmic axis so that the synthesized frequency characteristics become flat. Further although the comb filters are required to have many flat stages, by setting each delay time as exponential functions to arrange the oscillation peaks of the frequencies at octave intervals on auditory feeling the present invention may easily and effectively realize flatn frequency characteristics.

FIG. 2 is a view showing the second principle constitution according to the invention. Referring to FIG. 2, with this object in view, the essence of the present invention resides in a coefficient setting method of a plurality of parallel connected comb filters comprising the step of setting substantially multiplying coefficients of multipliers provided with said comb filters as $g_n = 10^{-3D_n/Rev}$, $Rev = -3 \times D1/\log_{10} g1$, where Dn is a delay time of nth delay device provided with said each comb filter and gn is a multiplying coefficient of multipliers of each comb filter.

With the above coefficient setting method of a plurality of parallel connected comb filters, the multiplying coefficients of each multiplier provided with each comb filter are given by the above equation so that the setting of the coefficients may be easy and also the frequency characteristics may be flat in the rear part of reverberation as well as in the front part thereof because the reverberation time of each comb filter is common, and the envelopes of the reverberation characteristics are the same as each other. That is to say, the impulse density of the rear reverberation may be constant to prevent a decrease and remain comfortable.

FIG. 3 is a view showing the third principle constitution according to the invention. Referring to FIG. 2, with this object in view, the essence of the present invention resides in a coefficient setting method of a plurality of parallel connected comb filters comprising the step of a coefficient setting method of a plurality of parallel connected comb filters including first delay memories taking in an input signal with a predetermined sampling period respectively, multipliers connected to outputs of the first delay memories, second delay memories connected to outputs of the first delay memories, second multipliers connected to outputs of the second delay memories, adders for adding outputs of said first multipliers and said second multipliers and said input signal with the predetermined sampling period, characterized by comprising the step of setting delay times of the first delay memories provided with each comb filter as $D1, D2, \ldots, Dn$, setting multiplying coefficients of the first multipliers provided with each comb filter as $g11, g21, \ldots, gn1$, setting the multiplying coefficients of the second multipliers provided with each comb filter as $g12, g22, \ldots, gn2$, and substantially holding a relation to said coefficients and delay times for which, $$gn1 + gn2 = 10^{-3Dn/Rev}, (n = 1, 2, \ldots, n)$$

$$Rev = -3D1/\log_{10}(g11 + g12), \text{ and}$$

$$g11/g12 = g21/g22 = \ldots gn1/gn2.$$

Further the essence of the present invention resides in a coefficient setting method of a plurality of parallel connected comb filters comprising the step of setting delay times of the second delay memories provided with each comb filter as T, and substantially holding the relation to said coefficients and delay times for which, $$gn1/gn2 =$$

$$((c^2 - \cos\omega T) - ((\cos\omega T + 1 - 2c^2)(\cos\omega T - 1))^{\frac{1}{2}})/(1 - c^2),$$

$$Rev = pDn = mD1, (n = 1, 2, \ldots, n, p, m: \text{constant}), \text{ and}$$

$$c = (((g12/g11)^2 + 2((g12/g11)\cos\omega T + 1)^{\frac{1}{2}})/(g12/g11 + 1))^{c1}$$

$$c1 = 2^{(1-n/Dan)}, (Dan: \text{stage number of the comb filters}).$$

With the above coefficient setting method of a plurality of parallel connected comb filters, the first and the second delay memories and the first and the second multipliers provided with each comb filter are given by the above equations so that the setting of the coefficients may easy and also the impulse density of the rear reverberation may be constant and almost flat in the rear part of reverberation, and the high frequency components may be removed in the rear part of the reverberation.

BRIEF DESCRIPTION OF THE DRAWINGS

FIG. 26 is a view showing a initial reflection sound and a reverberation sound reproduced by a prior reverberation unit;

DESCRIPTION OF THE PREFERRED EMBODIMENTS

The invention will be described in great detail with reference to specific embodiments thereof and an accompanying drawing.

Figure 1:
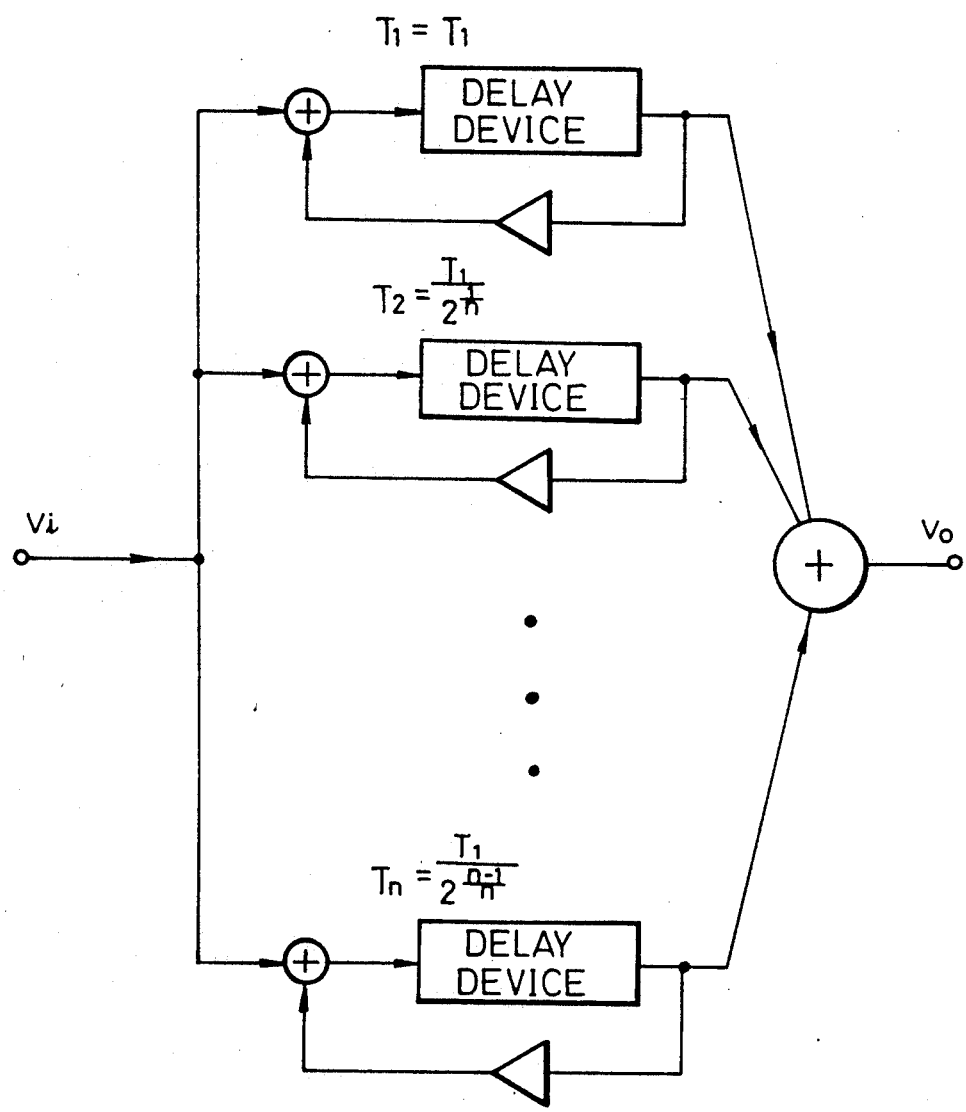
FIGS. 1 is a view showing the first principle constitution according to the invention.
Figure 2:
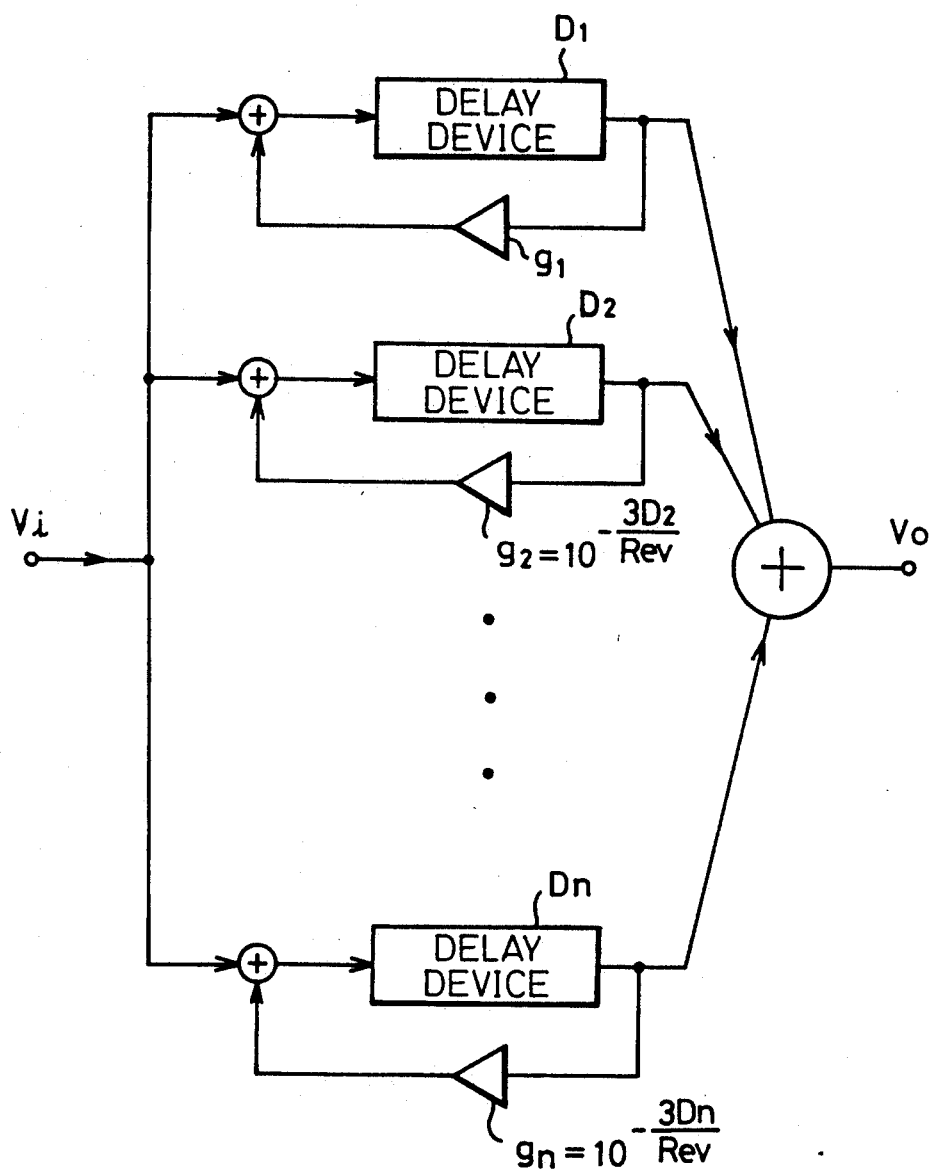
FIG. 2 is a view showing the second principle constitution according to the invention.
Figure 3:
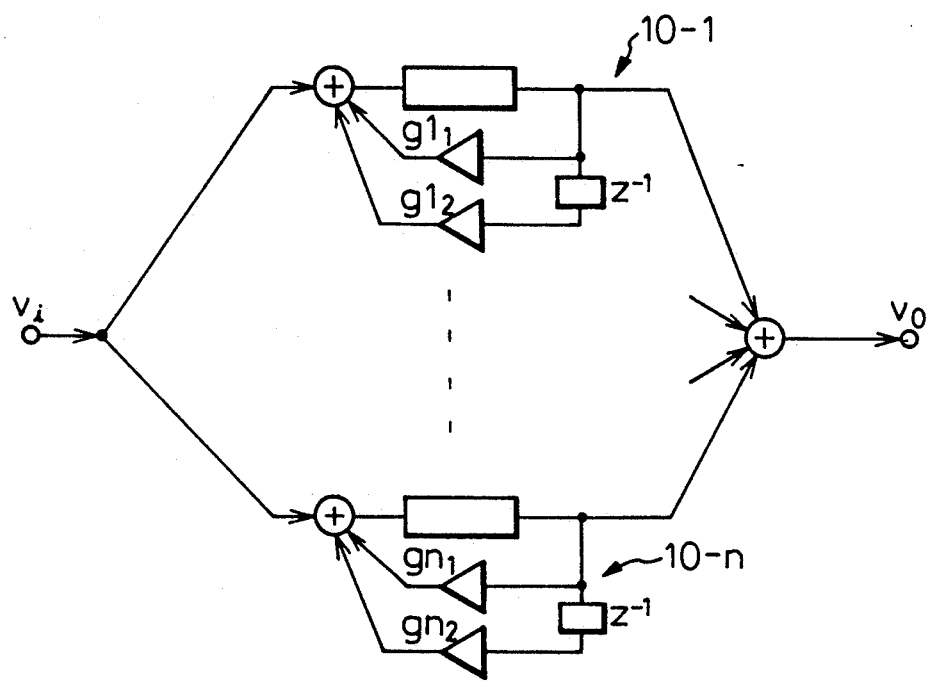
FIG. 3 is a view showing the third principle constitution according to the invention.
Figure 4:
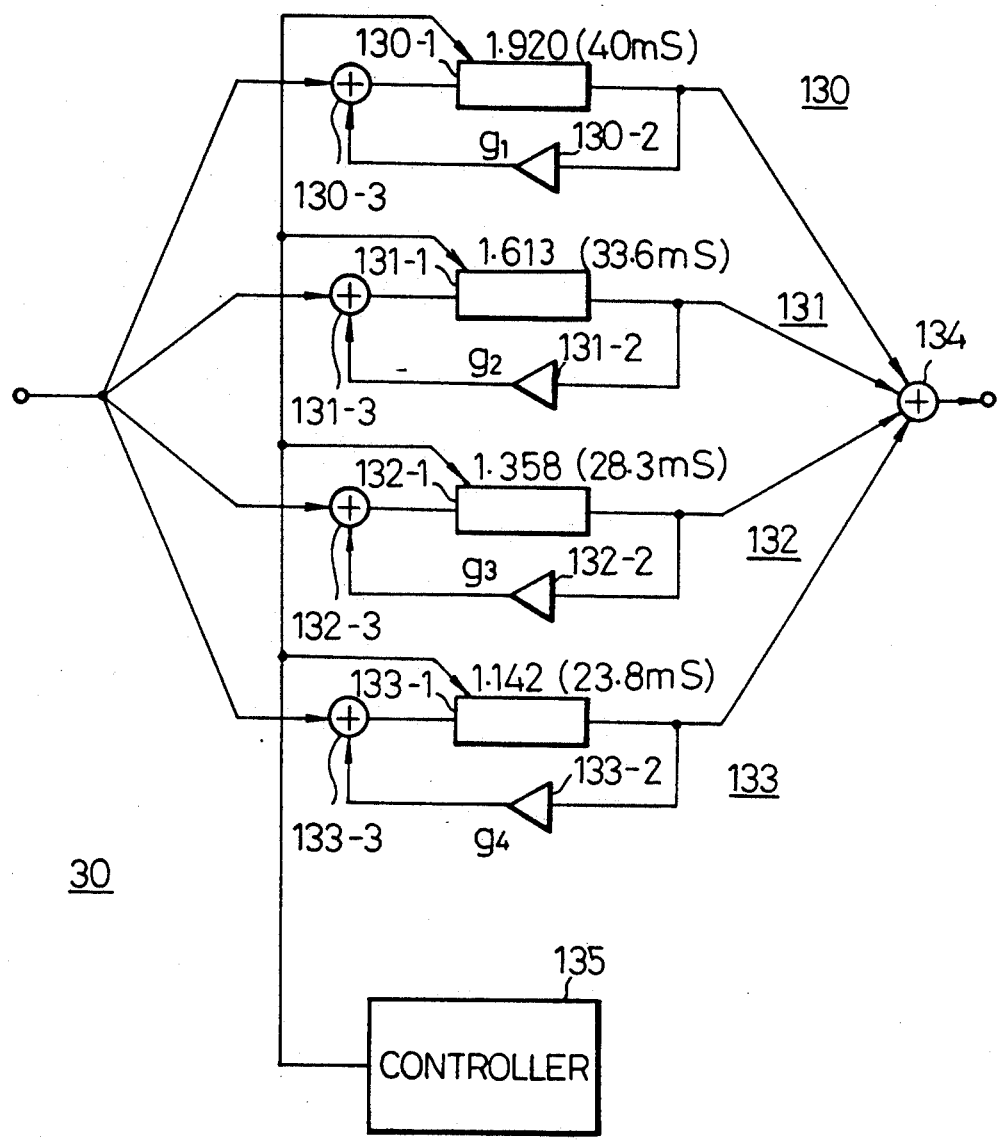
FIG. 4 is a view illustrating a coefficients setting method of a reverberation unit according to the first embodiment of the invetion.

FIG. 4 is a view illustrating a coefficient setting method of a reverberation unit according to the first embodiment of the invention. As shown in this Figure for a brief explanation, connection of four comb filters in parallel formation will be discussed hereafter. Refferring to FIG. 4, the reverberation device 30 made of DSP includes, as a first~a fourth comb filter 130, 131, 132 and 133, delay devices 130-1, 131-1, 132-1 and 133-1, multipliers 130-2, 131-2, 132-2 and 133-2, adders 130-3, 131-3, 132-3 and 133-3, an adder for adding each output of the delay devices 130-1, 131-1, 132-1 and 133-1, and a controler 135 for controling the setting of delay time $Tk = T1/2^{(k-1)/4} (k = 1 \sim 4)$ to each of the delay devices 130-1, 131-1, 132-1 and 133-1.

A delay time T1 of the delay device 130-1 is determined if a music concert hall is specified and set, for example as 40 ms. Here setting a sampling frequency $fs = 48$ kHz, we find that tap numbers $Tap1 = 48$ kHzx ms = 1920. Next, a delay time T2 of the delay device 131-1 is set as $T2 = T1/2^{\frac{1}{4}} = 40$ ms$/2^{\frac{1}{4}} = 33.6$ ms. Then, we find that the tap numbers $Tap2 = 48$ kHz x 33.6 ms = 1613. Further a delay time T3 of the delay device 132-1 is set as $T3 = T1/2^{2/4} = 40$ ms$/2^{2/4} = 28.3$ ms Then, we find that the tap numbers $Tap3 = 48$ kHz x 28.3 ms = 1358. Also a delay time T4 of the delay device 133-1 is set as $T4 = T1/2^{3/4} 40$ ms$/2^{3/4} = 23.8$ ms. Then, we find that the tap numbers $Tap4 = 48$ kHz x 23.8 ms = 1142.

Figure 5:
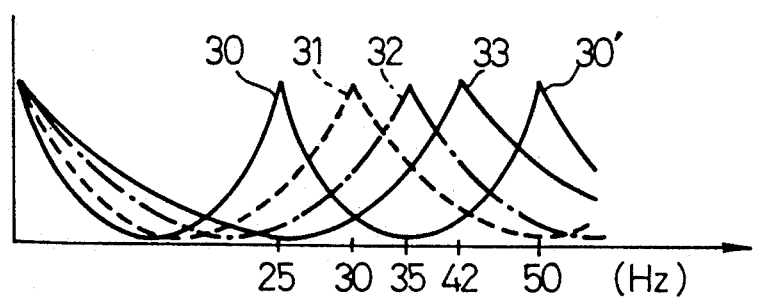
FIG. 5 is a view showing positions in peak frequencies of standard oscillation of each comb filter.

FIG. 5 is a view showing positions in peak frequencies of standard oscillation of each comb filter. Referring to FIG. 5, a peak frequency in standard oscillation of the first comb filter 130 is 1/40 ms = 25 Hz; a peak frequency in standard oscillation of the second comb filter 131 is 1/33.6 ms = 30 Hz; a peak frequency in standard oscillation of the third comb filter 132 is 1/28.3 ms = 35 Hz, and a peak frequency in standard oscillation of the fourth comb filter 133 is 123.8 ms = 42 Hz.

A peak frequency 30' in the Figure, for reference, is a primary higher harmonic frequency (50 Hz).

The foregoing is a discussion for a coefficient setting method of the reverberation unit having four comb filters, while generally a delay time Tk of a kth comb filter of a connection of plural (n) comb filters in parallel formation is set as $Tk = T1/2^{(k-1)/n}$. Then we find that tap position $Tapk = fs \times Tk = T1 \times fs /2^{(k-1)/n}$ and also a peak frequency of standard oscillation fs is $fs = 1/Tk = 2^{(k-1)/n}/T1$.

The peak frequencies in standard oscillation of each comb filter obtained in this way, are arranged at uniform intervals on a logarithmic axis in a theoretical octave not easily piled. Further the above intervals do not easily cause a periodical "habit" in auditory feeling. Therefore the minimum number of stages of comb filters may achieve flat frequency characteristics. In the case, the multiplying coefficients of the multipliers 130-2, 131-2, 132-2 and 133-2 as shown in FIG. 4 may be arbitrary g1, g2, g3 and g4 respectively.

As set forth above, according to the present invention, delay time Tk of the kth delay device in n stages parallel connected comb filters is set as $Tk = T1/2^{(k-1)/n}$ so that frequencies arising owing to standard oscillation peaks of each comb filter may be arranged at uniform intervals on a logarithmic axis and flat frequency characteristics may be simplified to facilitate operation for making a variation of reverberation sounds.

Figure 6:
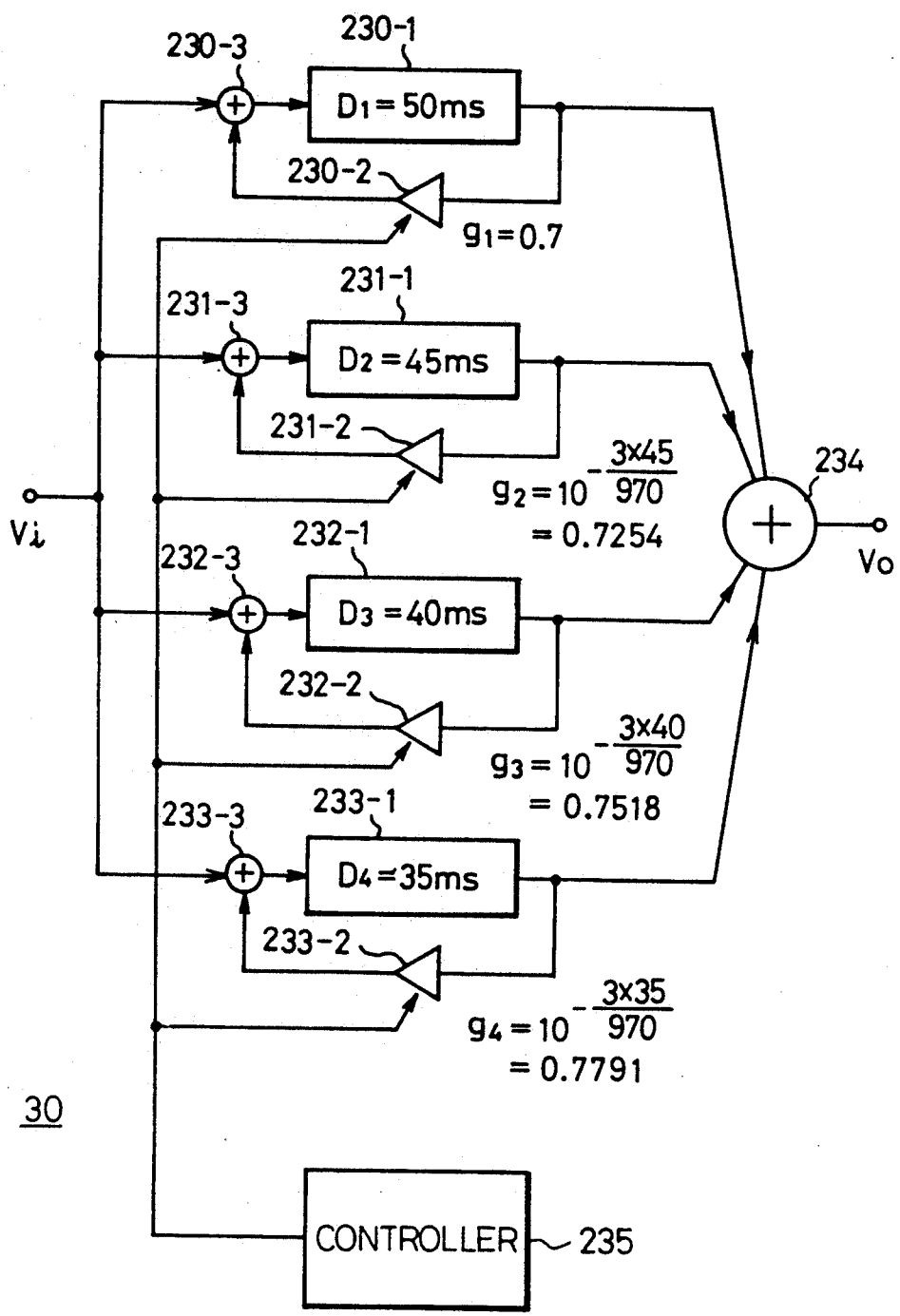
FIG. 6 is a view illustrating a coefficients setting method of a reverberation unit according to the second embodiment of the invention.

FIG. 6 is a view illustrating a coefficient setting method of a reverberation unit according to the second embodiment of the invention. An arrangement as shown in FIG. 6 is the same as that as shown in FIG. 4, whereas a description is omitted.

Figure 7:
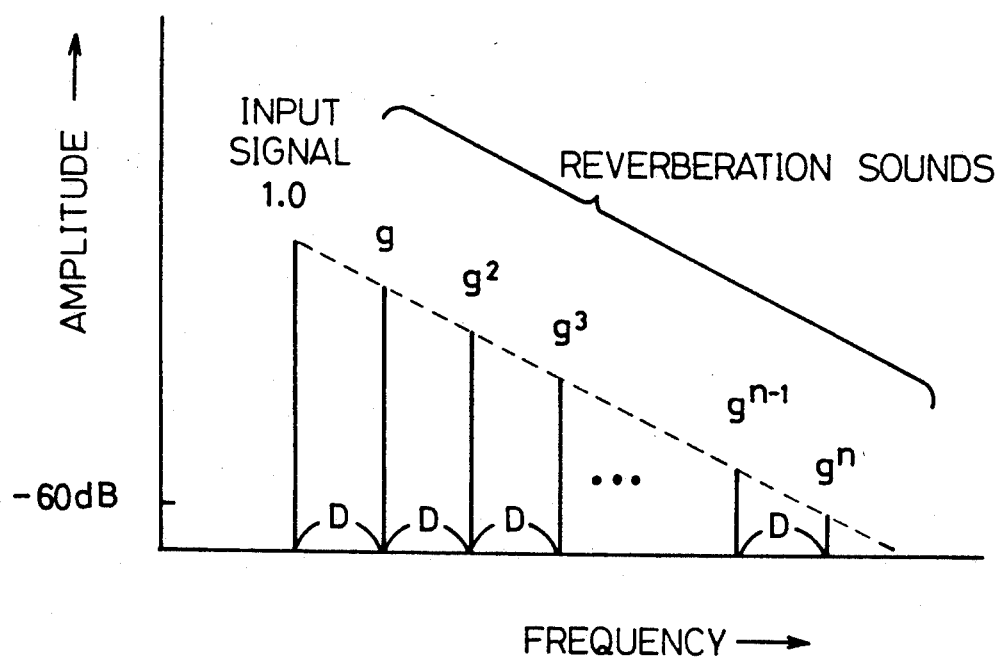
FIG. 7 is a view illustrating a reverberation sound reproduction of a comb filter of FIG. 7.

FIG. 7 is a view illustrating a reverberation sound reproduction of a comb filter of FIG. 6. Referring to FIG. 7, setting a delay time D and a multiplying coefficient $g(g<1)$ of this comb filter and normalizing an input signal level as 1.0, a first reverberation sound is delayed by D duration from the input signal and its level is g, a second reverberation sound is delayed further by D duration therefrom and its level is $g^2$, ..., and nth reverberation sound is delayed by nD duration from the input signal and its level is $g^n$. Setting the reverberation time to reduce the input signal to $-60$ dB as Rev, we find that $20\log_{10}g^n = 20n\log_{10}g = -60$, $Rev = nD(\text{sec})$, $Rev = -3 \times D/\log_{10}g(\text{sec})$.

The above reverberation time Rev is determined because of reverberation characteristics of the venue such as a concert hall, a live house, a church, stadium etc. Based on the time Rev, delay times $D1 \sim D4$ of each said delay device and a multiplying coefficient of any multipliers 230-2, 231-2, 232-2 and 233-2, for example, the multiplying coefficient g1 of the multiplier 230-2 is determined.

And other multiplying coefficients gn of the multiplying devices 231-2, 232-2, 233-2 are derived as $gn = 10^{-3Dn/Rev}(n=2,3,4)$ $(gn(\text{Max}) \leq 1$, or gain $\leq 1$ for minimum among D1, D2 ..., Dn), because a gain of a block (a filter) in which a delay time is the smallest (shortest) is made the largest. In an example of FIG. 6, since D4 is the smallest, g4 is made the largest. Accordingly, normally, after the gain of the block in which the smallest delay time is determined, gains of the other blocks are calculated. In addition, assuming $gn(\text{Max}) \leq 1$, one of those may be g1. In this way the multiplying coefficients si determined so that the reverberation times Rev of the comb filters are common, and an envelope of the reverberation characteristics in each stage of the rear part of the reverberation may coexist.

In order to explain concretely the embodiment of FIG. 7 using the numerical value, setting $D1 = 50$ ms, $D2 = 45$ ms, $D3 = 40$ ms, $D1 = 35$ ms, $g1 = 0.7$, we find that $\text{Rev} = -3 \times 50$ ms$/\log_{10}0.7 = 970$ ms, $g2 = 10^{-3D2/970}32 \quad 0.7254$, $g3 = 10^{-3D3/970} = 0.7518$, $g4 = 10^{-3D4/970} = 0.7791$.

Additionally, generally multiplying coefficients of n stage comb filters is indicated as $gn = 10^{-3Dn/Rev}$.

According to one aspect of setting this multiplying coefficient, as delay time is smaller, a multiplying coefficient is greater and thereby reducing envelopes in the rear part of reverberation of each comb filter are the same to maintain almost a regular density of reverberation from the front part to the rear part of the reverberation and facilitate setting coefficients by the controler 230.

Further as an additional embodiment, the controler 230 may set a multiplying coefficient gk of the kth comb filter in the n stage comb filters as $gk = 10^{-3Dk/Rev}$ and a delay time Dk as $Dk = D1/2^{(k-1)/n}$. This delay time is set at the same time so that the setting of comb filter coefficients becomes easier synthetically. This setting of the delay time allows the peak frequencies in standard oscillation of each comb filter to be arranged at even intervals on the logarithmic axis as shown in FIG. 6 so as to simplify the flatness of the synthesized frequencies of the comb filters and optimize the comb filters.

As set forth above according to the embodiment, nth delay coefficient of plural parallel connected comb filters is set as Dn, a multiplying coefficient of a multiplier is set as $gn = 10^{-3Dn/Rev}$, $Rev = -3 \times D1/\log_{10} g1$ so that reverberation times of each comb filter may be the same uncomfortable sounds may be removed and the setting of the coefficients may be simple.

Figure 8:
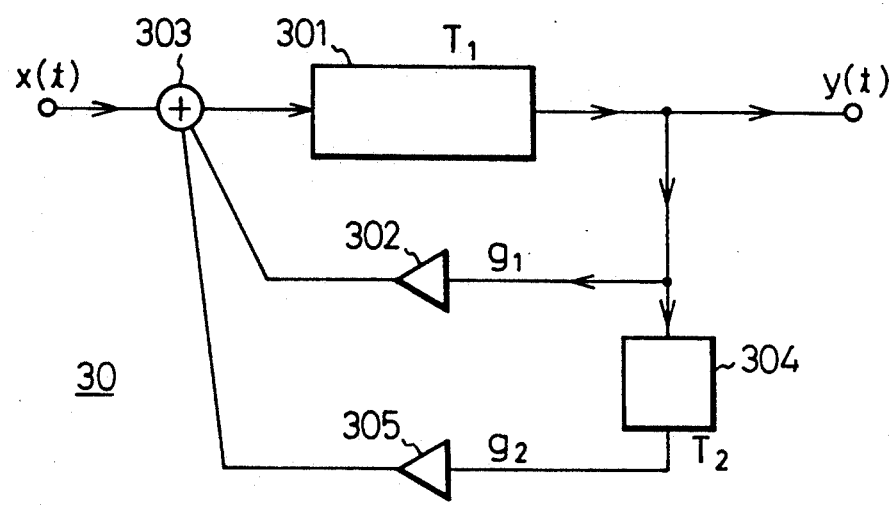
FIG. 8 is a view showing a reverberation unit according to the third embodiment of the invetion.

FIG. 8 is a view showing a reverberation unit according to the third embodiment of the invention. Referring to FIG. 8, the constitution will be described hereafter. The reverberation device 30 includes a first memory 301 taking in an input signal with a given sampling period, a first multiplier 302 multiplying an output signal of the first delay memory 301 that delays the input signal by T1 duration, by a predetermined coefficient, an adder 303 for adding an output signal of the first multiplier 302 and said input signal, a second delay memory 304 taking in the output signal of said first delay memory 301 and a second multiplier 305 multiplying an output signal of the second delay memory 304 that delays the output signal of the first delay memory 301 by a sampling period T2 by a predetermined coefficient to add said input signal thereto at the adder 303.

Here the first delay memory 301, the first multiplier 302 and an adder 303 reproduce reverberation, and the first and second multiplier 302 and 305; the second delay memory 304 and the adder 303 remove the high frequency components of the rear part of reverberation.

Next, an operation of this embodiment will be discussed hereafter.

Figure 9:
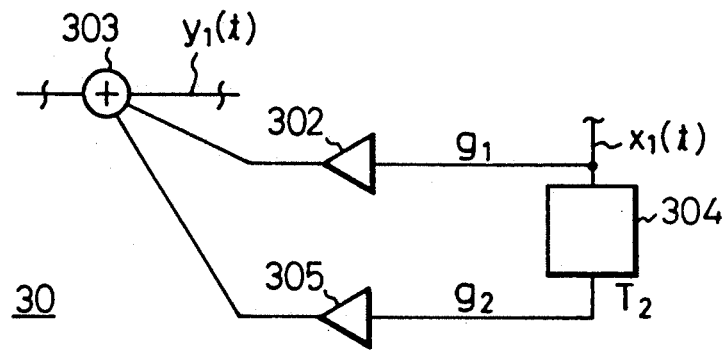
FIG. 9 is a view illustrating removal of a high frequency component.

FIG. 9 is a view illustrating removal of high frequency component that cuts out a portion of FIG. 9. Refferring to FIG. 9, setting the input signal of the second delay memory 304 as xl(t) and the output signal of the adder 303 as yl(t), we find that $$yl(t) = g1 \times l(t) + g2 \times 1(t - T2).$$

Here, setting xl(t)=exp (jωt), we find that $$yl(t) = g1\exp(j\omega t) + g2\exp(j\omega(t - T2))$$
$$= (g1 + g2\exp(-j\omega T2))\exp(j\omega jwt).$$

Here, setting amplitude $A(\omega) = g1 + g2\exp(-j\omega T2)$, we find that $$|A(\omega)| = (g1^2 + g2^2 + 2g1g2\cos(\omega T2))^{\frac{1}{2}}.$$

Here, setting a sampling period as fs=44.1 kHz, we find that T2=1/fs=22.7 μs.

Figure 10:
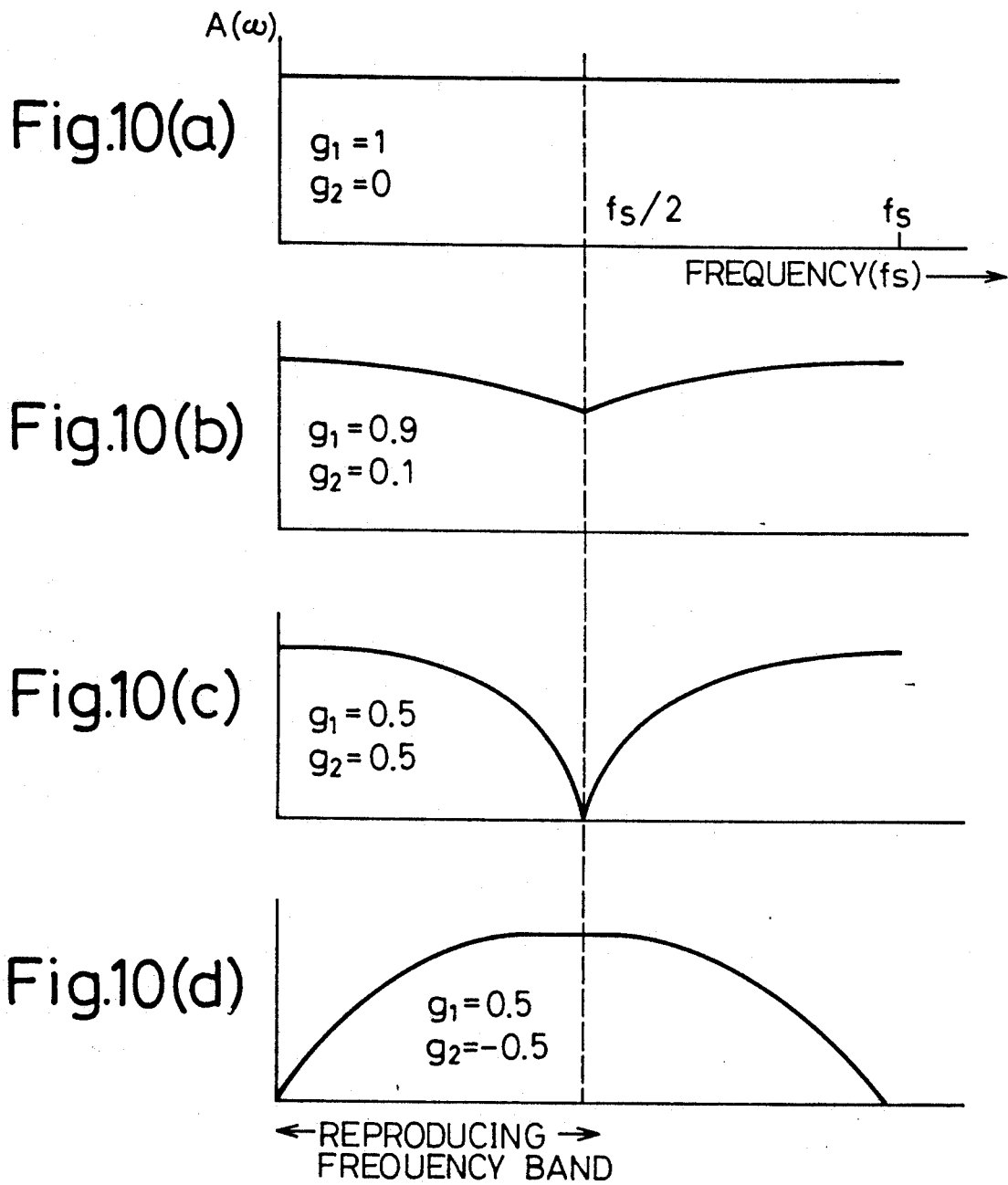
FIGS. 10(a)–(10d) are a view illustrating amplitude characteristics $|A(\omega)|$.
Figure 11:
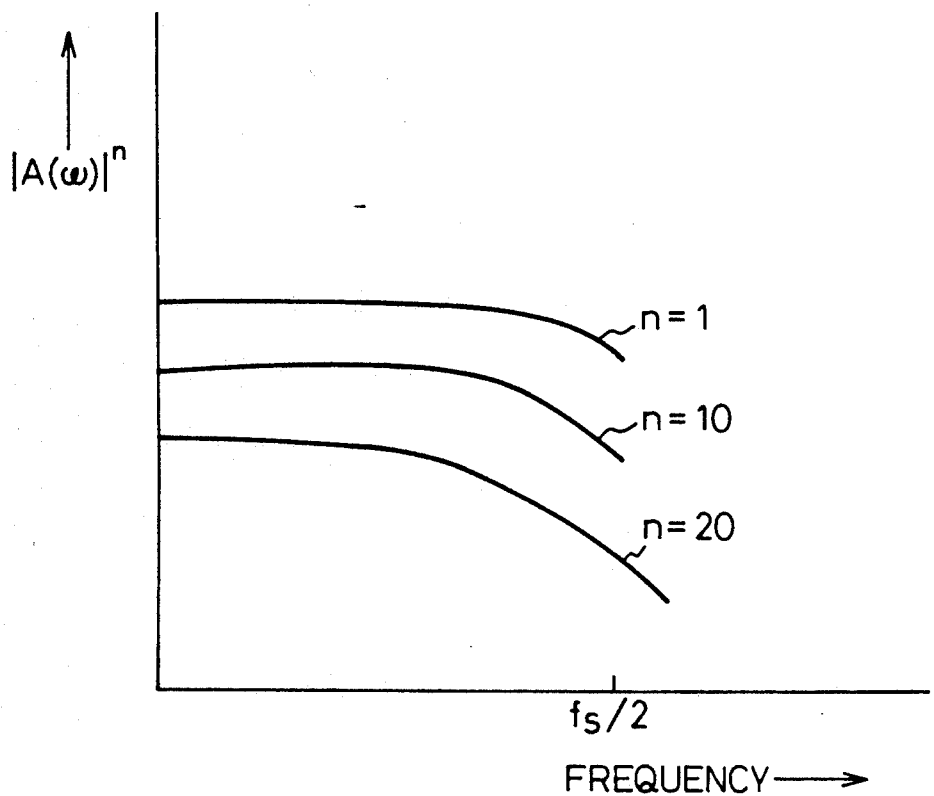
FIG. 11 is a view illustrating amplitude characteristics $|A(\omega)|^n$.

FIG. 10 is a view illustrating amplitude characteristics $|A(\omega)|$. A frequency on the horizontal axis as shown in this FIG. 11 shows 0~fs/2 range of reproduced frequency band. In the characteristics of $|A(\omega)|$ of this FIG. 10(a), if the multiplying coefficients of the first and the second multipliers 302 and 305 are set as g1=1, g2=0, these characteristics show no low pass filtering. In this FIG. 10(b), if they are set as g1=0.9, g2=0.1, these characteristics show low pass filtering. And similarly in this FIG. 10(c), if they are set as g1=0.5, g2=0.5, these characteristics show low pass filtering. In this FIG. 10(d), if they are set as g1=0.5, g2=−0.5, these characteristics show high pass filtering.

Next, approximately setting T1>>T2 and setting the input signal of the first delay memory 301 as x(t) and the output signal thereof as y(t), the next equation holds by accepting reduction of the output signal at every feedback thereof.

$$y(t) = x(t - T1) + |A(\omega)| x(t - 2T1)$$
$$+ |A(\omega)|^2 x(t - 3T1) + \ldots +$$
$$|A(\omega)|^{n-1} x(t - nT1).$$

Therefore as the reverberation sounds change from the front part of reverberation to the rear part thereof, degrees of the amplitude $|A(\omega)|$ increase.

FIG. 11 is a view illustrating amplitude characteristics $|A(\omega)|^n$. Setting $|A(\omega)|$ as shown in FIG. 11(b) when n=1, in the case of low degrees of $|A(\omega)|$ the reverberation device 30 passes through high frequency components comparatively but apparently in the case of high degrees thereof it can hardly pass through the high frequency components.

Figure 12:
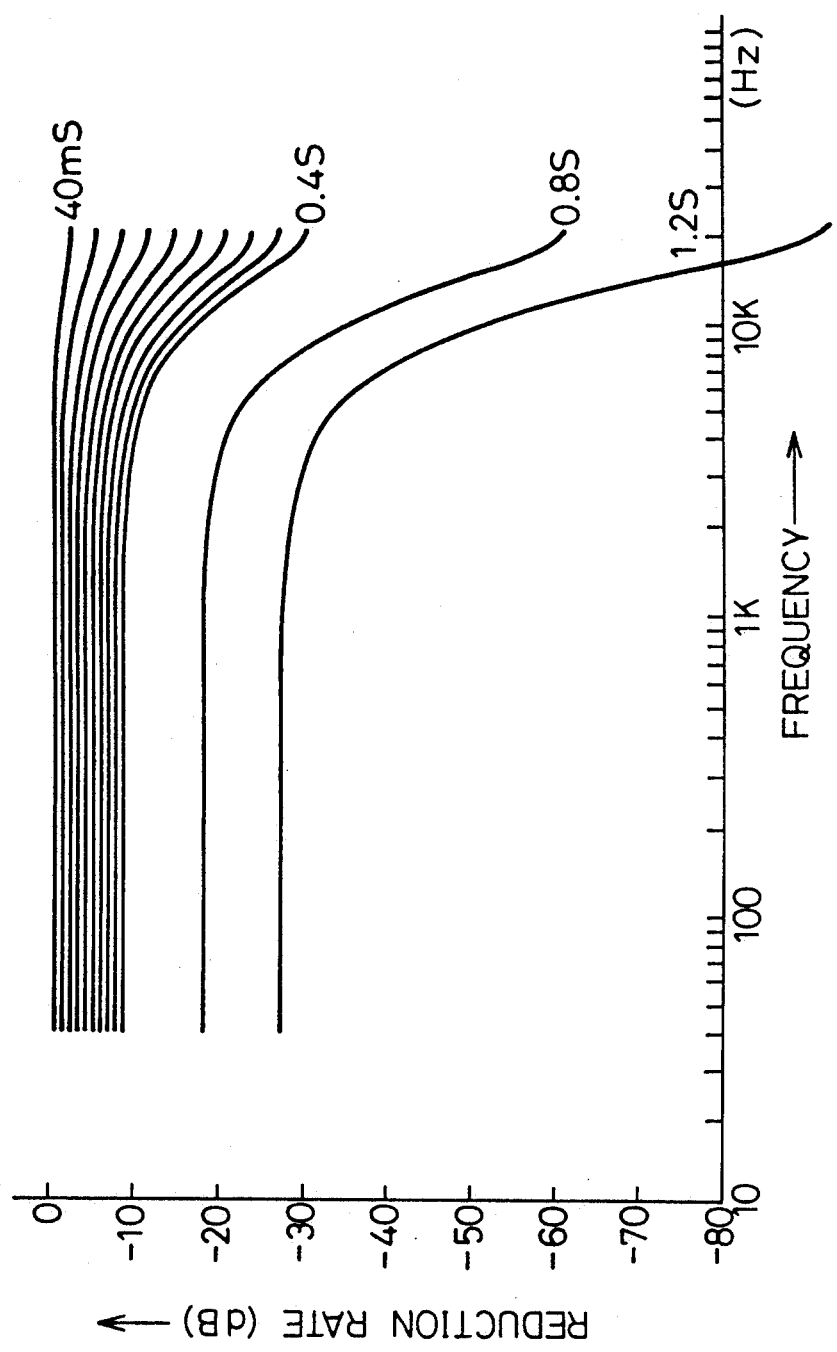
FIG. 12 is a characteristic view showing experiment data of the reverberation unit according to the invention.

FIG. 12 is a characteristic view showing experiment data of the reverberation unit according to the invention. The characteristics of the reverberation unit as shown in FIG. 12, is obtained by setting the delay time T1 of the delay memory 301 as 40 ms, the multiplying coefficient g1 of the multiplier 302 as 0.8, the multiplying coefficient g2 of the multiplier 305 as 0.1 and the sampling frequency as 44.1 kHz.

As is evident from these characteristics, every time a delay is repeated periodically, that is to say, as the repetition becomes the rear part of reverberation, reduction of high frequency increases gradually together with level reduction over the whole frequency band to remove high frequency components.

Therefore according to the present embodiment with a simple construction the high frequency components in the front part of reverberation remains so that the high frequency components in the rear part thereof may be simply removed. Additionally, if $|A(\omega)|$ is set as shown in FIG. 11(d), incidentally on the contrary to the above, low frequency components of only the rear part of reverberation may be simply removed.

Figure 13:
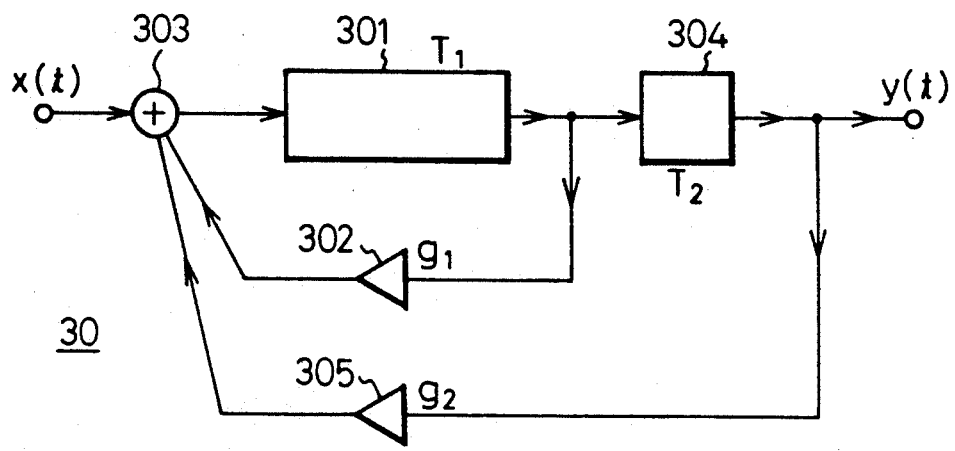
FIG. 13 is a view showing a reverberation unit according to the fourth embodiment of the invention.
Figure 14:
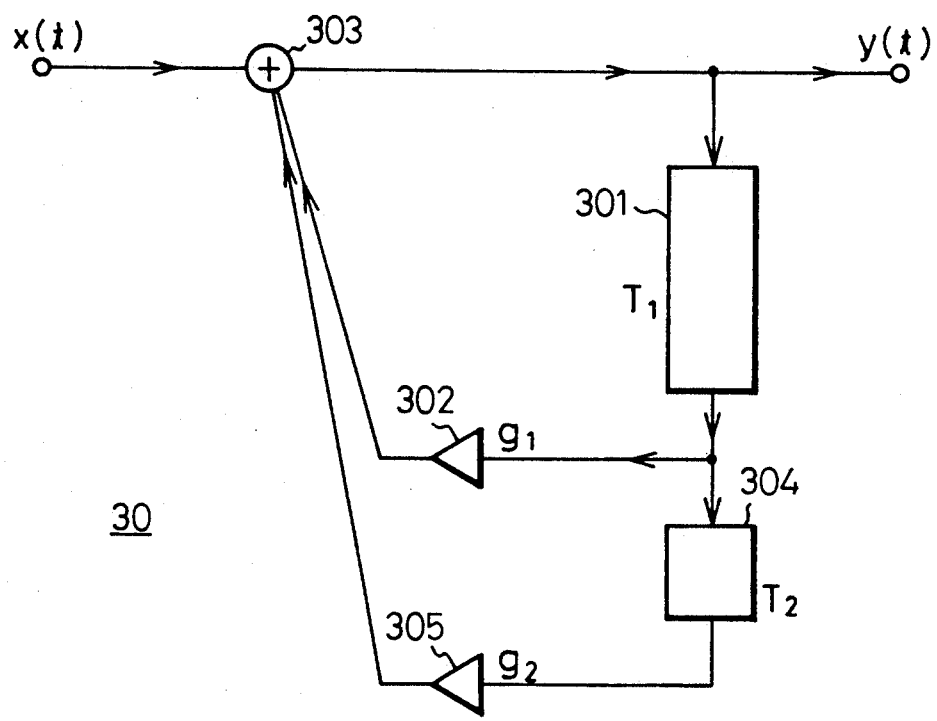
FIG. 14 is a view showing a reverberation unit according to the fifth embodiment of the invention.

FIG. 13 is a view showing a reverberation unit according to the fourth embodiment of the invention. According to the different constitutions of the first embodiment in FIG. 8, the output signal y(t) is not taken from the output of the delay memory 301 but from the output of the second memory 304. Effect and operation are obtained in the same way as the first embodiment FIG. 14 is a view showing a reverberation unit according to the fifth embodiment of the invention. According to the different constitutions of the fifth embodiment in FIG. 8, the output signal y(t) is not taken from the output of the delay memory 301 but from the input of the delay memory 301. Effect and operation are obtained in the same way as the first embodiment.

Figure 15:
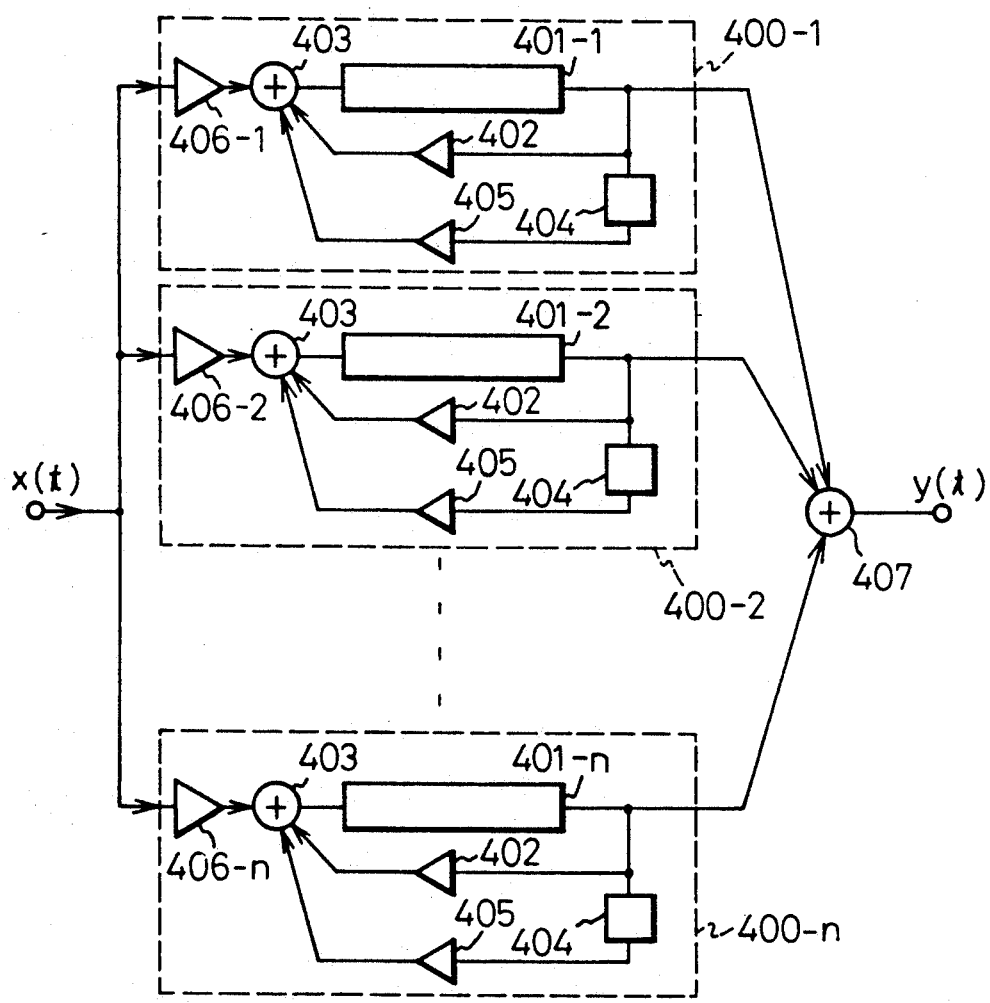
FIG. 15 is a view showing the reverberation unit according to the sixth embodiment of the invention.

FIG. 15 is a view showing the reverberation unit according to the sixth embodiment of the invention. Referring to FIG. 15, the reverberation device 30 comprises a plurality of reverberation devices 400-1, 400-2, . . . ,400-n for adding a plurally divided input signal to reverberation sounds, which include first delay memories 401-1, 401-2, . . . ,401-n that take in respectively an input signal with a given sampling period, first multipliers 2 for multiplying output signals that the first delay memories 401-1, 401-2, . . . , 401-n by D1, D2, . . . ,Dn by predetermined coefficients g1, adders 403 for output signals of said first delay memories and said input signal; second memories 404 taking in respectively output signals of said first delay memories; second multipliers 405 for multiplying output signals of said second delay memories 404 that delay the output signals of said first delay memories by a sampling period T2 by predetermined coefficients g2 to add said output signals thereof to the said input signal at said adder 403; multipliers 406-1, 406-2, . . . , 406-n for adjusting input signal levels of the reverberation devices 400-1, 400-2, . . . , 400-n, and an adder 407 for adding output signals of the first delay memories 401-1, 401-2, . . . ,401-n.

Each of the reverberation devices 400-1, 400-2, . . . , 400-n including elements according to the third embodiment of FIG. 9 may be replaced respectively by the elements according to the fourth or the fifth embodiment of the FIGS. 13 and 14.

According to the present embodiment, when for example, the reverberation sounds at a listener's optional position in a music concert hall is artificially realized in a room or a vehicle, especially removal of high frequency components is easily effected in the rear part of reverberation.

Additionally, in the present embodiment, the multiplying coefficients g1 and g2 of the first and the second multipliers in each of the reverberation devices 400-1, 400-2, . . . ,400-n may be different respectively.

Figure 17:
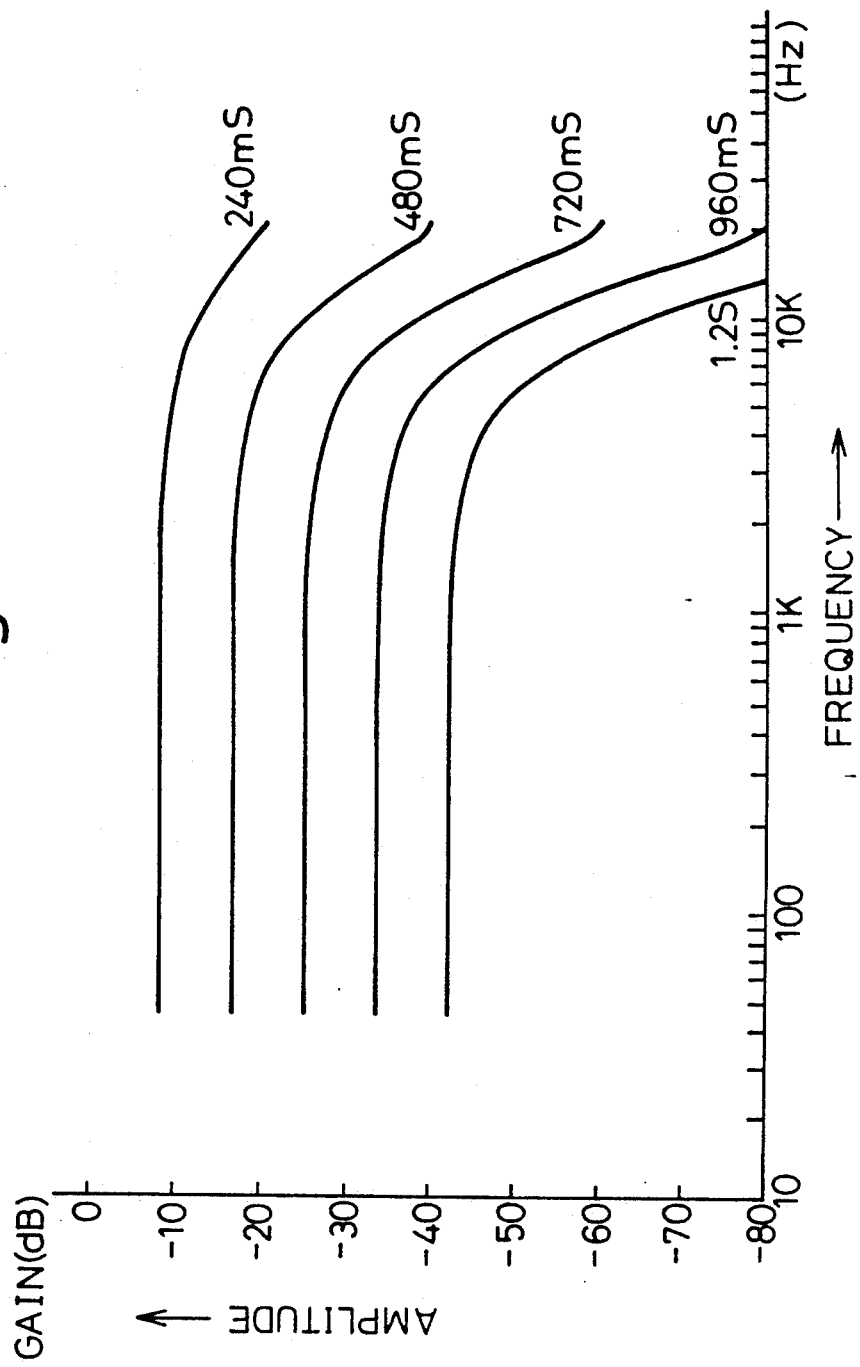
FIG. 17 is a view showing frequency characteristics of a comb filter 500-1.

FIG. 17 is a view illustrating a coefficient setting method of a reverberation unit according to the seventh embodiment of the invention. Referring to FIG. 17, the reverberation device 30 comprises four stage parallel connected comb filters 500-1, 500-2, 500-3, 500-4 including respective first delay memories 501-1, 501-2, 501-3, 501-4, first multipliers 502-11, 502-21,502-31, 502-41 connected to respective the first delay memories, adders 503-1, 503-2,503-3, 503-4 for adding respective output signals of the first multipliers and an input signal, second delay memories 504-1, 504-2,504-3, 504-4 connected to respectively outputs of the first delay memories, second multipliers 502-12, 502-22,502-32, 502-42 connected respectively between the second delay memories 504-1, 504-2,504-3, 504-4 and the adders 503-1, 503-2,503-3, 503-4, an adder 520 for adding outputs of the first delay memories and a controller for setting delay times D1, D2, D3, D4 of the first delay memories and multiplying coefficients g11, g12, g21, g22, g31, g32, g41, g42 of the first and the second multipliers. The above reverberation device 30 of four stage comb filters is an example for simplifying explanation. This present embodiment intends to realize reverberation sounds of the optional listener's position of the music concert hall in the same way as the sixth embodiment. Especially in four stage comb filters of the present embodiment, returning to FIG. 10, when in the FIG. 10 (a) (b),(c), rate of multiplying coefficients g1 and g2 is changed, since amplitude in the high frequency region near fs/2 is different, rate of the first and the second multiplying coefficients is different and each frequencies characteristics become irregular. Also, since the delay time of each first delay memory in each comb filter is different to realize the reverberation of the listener's position and therefore a reverberation time resulting in −60 dB is different, in the rear part of reverberation only a portion of comb filters reproduces sounds such as "ziriziri,ctirictiri". In order to prevent such sounds from reproducing, generally the controller 530 makes such coefficients substantially maintaining the following relation.

Thus, setting the coefficients as g11/g12=g21/g22=g31/g32=g41/g42, high frequency reduction occurs and is constant in every periodical time at each stage of comb filters 500-1, 500-2, 500-3, 500-4.

Figure 16:
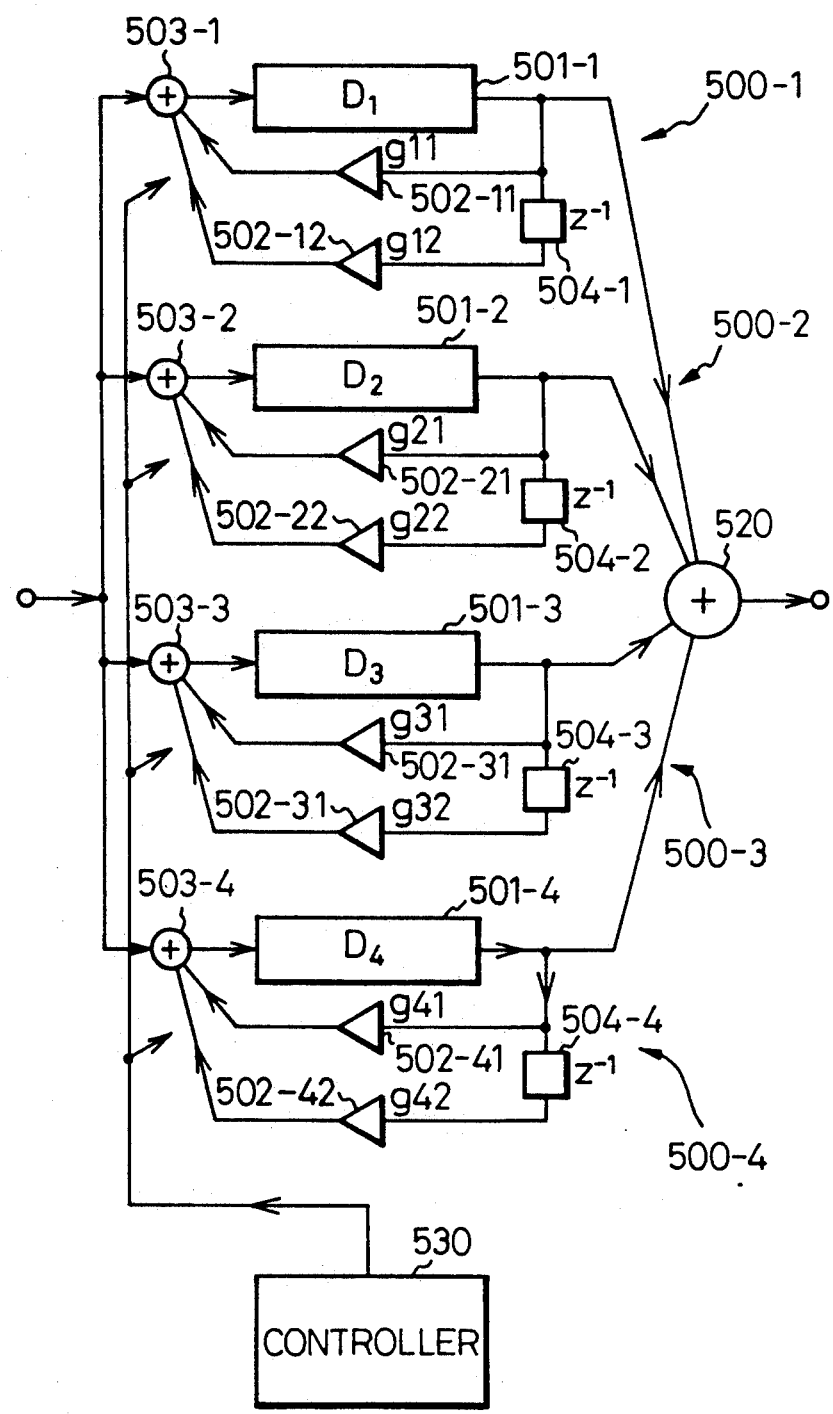
FIG. 16 is a view illustrating a coefficient setting method of a reverberation unit according to the seventh embodiment of the invetion.

Further, setting the coefficients as the following relation, $$gn1+gn2=10^{-3Dn/Rev}, (n=1,2,3,4)$$

$$Rev=-3D1/\log_{10}(g11+g12)$$

the reverberation time (time until reducing the reverberation sound envelope to −60 dB) is constant. The above coefficients are set to the elements of the each comb filter by the controller 30 so as to satisfy the above relation. The following table shows an example for setting the coefficients to the reverberation device of FIG. 16.

| COMB FILTER | DELAY TIME | gn1 + gn2 | gn1 | gn2 |
|---|---|---|---|---|
| 1 | 40 ms (D1) | 0.850 | 0.756 | 0.085 |
| 2 | 35 ms (D2) | 0.867 | 0.780 | 0.087 |
| 3 | 30 ms (D3) | 0.885 | 0.797 | 0.088 |
| 4 | 25 ms (D4) | 0.903 | 0.813 | 0.090 |

As shown in the above table, setting the delay times as D1=40 ms, D2=35 ms, D3=30 ms and D4=25ms, the coefficients as g11+g12=0.85, g11/g12=9(g11=0.756, g12=0.085), we find that due to the above equation, $$g11/g12 = g21/g22 = g31/g32 = g41/g42 = 9$$

$$Rev = -3D1/\log_{10}(g11 + g12)$$
$$= -3 \times 40/\log_{10}0.85$$
$$= 1700 \text{ ms}$$

$$g21 + g22 = 10^{-3D2/1700} = 0.867$$

$$g31 + g32 = 10^{-3D3/1700} = 0.885$$

$$g41 + g42 = 10^{-3D4/1700} = 0.903$$

and, $$g21 = 0.780, g22 = 0.885, g31 = 0.903,$$

$$g32 = 0.088, g41 = 0.813, g42 = 0.090.$$

FIG. 17∼20 are views showing frequency characteristics of comb filters 500-1,500-2,500-3,500-4. Frequency characteristics are obtained using the above setting coefficients. On behalf of FIG. 17 operation of the comb filter will be discussed hereafter. Five curved lines from up to down in FIG. 17 are frequency characteristics after the lapse of 240 ms, 480 ms, 720 ms, 960 ms, 1.2 s(1200 ms) respectively since inputting a signal, having 12 periods (480 ms=40 ms×12), 18 periods (720 ms=40 ms×18), 24 periods (960 ms=40 ms×24), 30 periods (1200 ms=40 ms×30) respectively.

Figure 18:
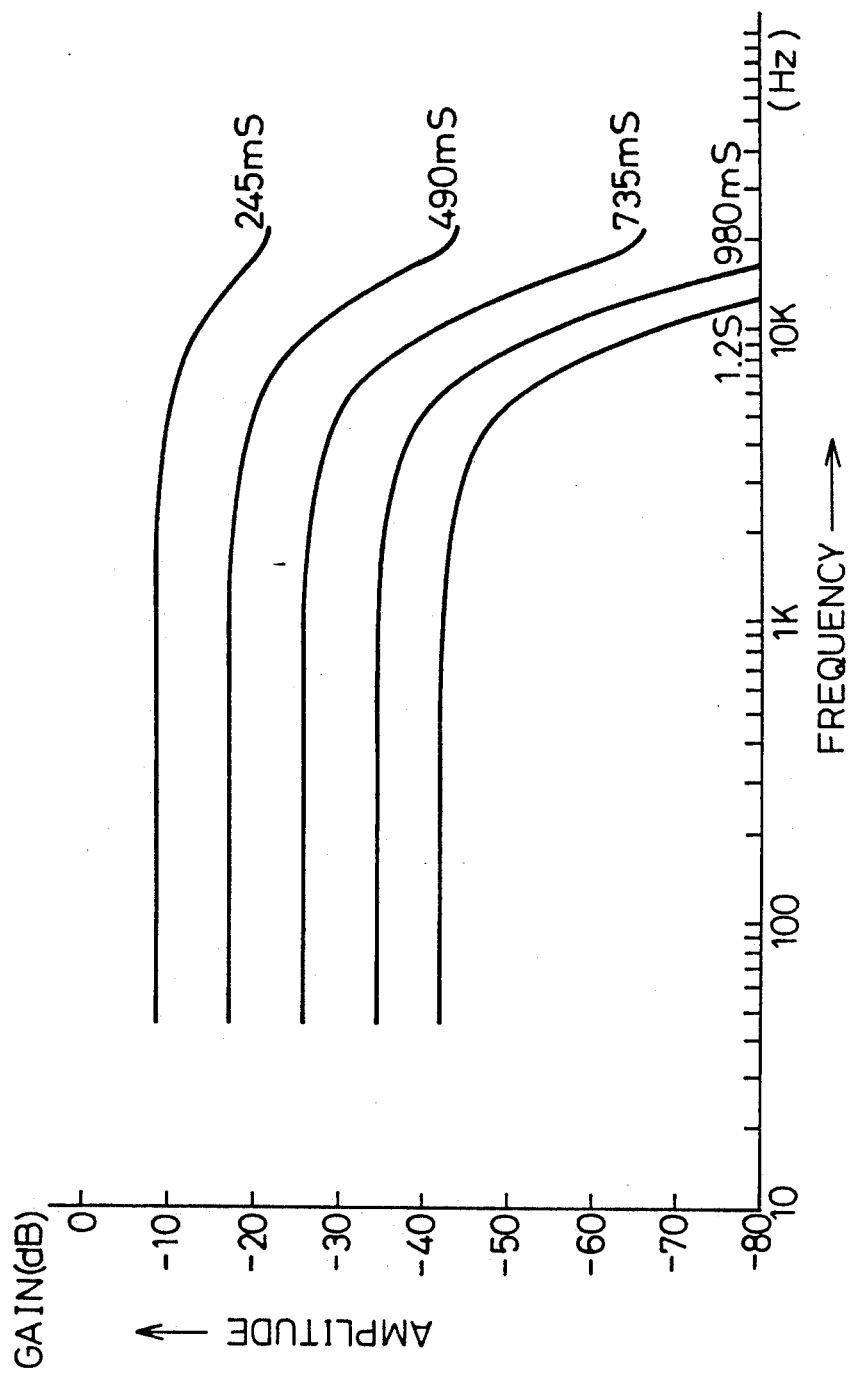
FIG. 18 is a view showing frequency characteristics of a comb filter 500-2.
Figure 19:
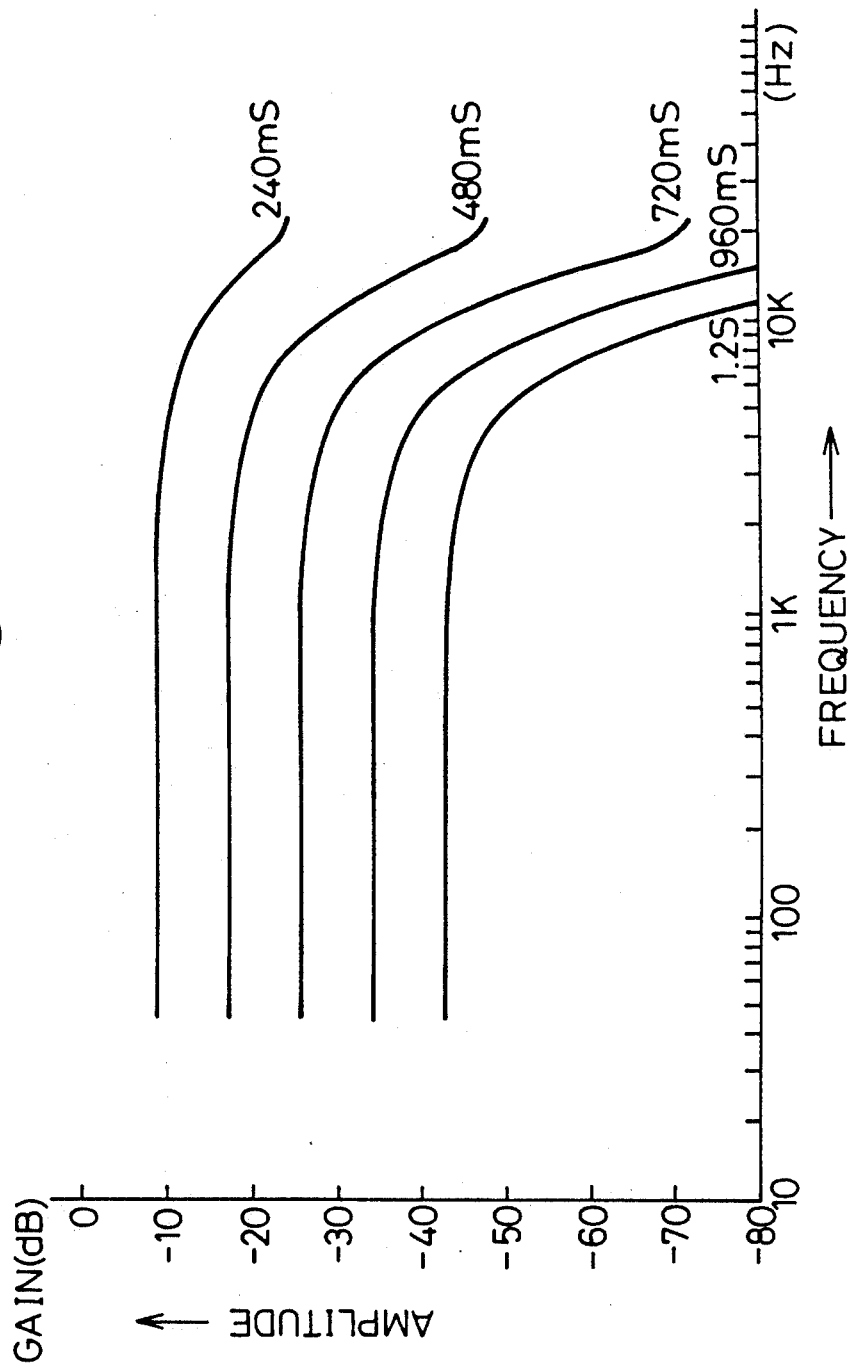
FIG. 19 is a view showing frequency characteristics of a comb filter 500-3.
Figure 20:
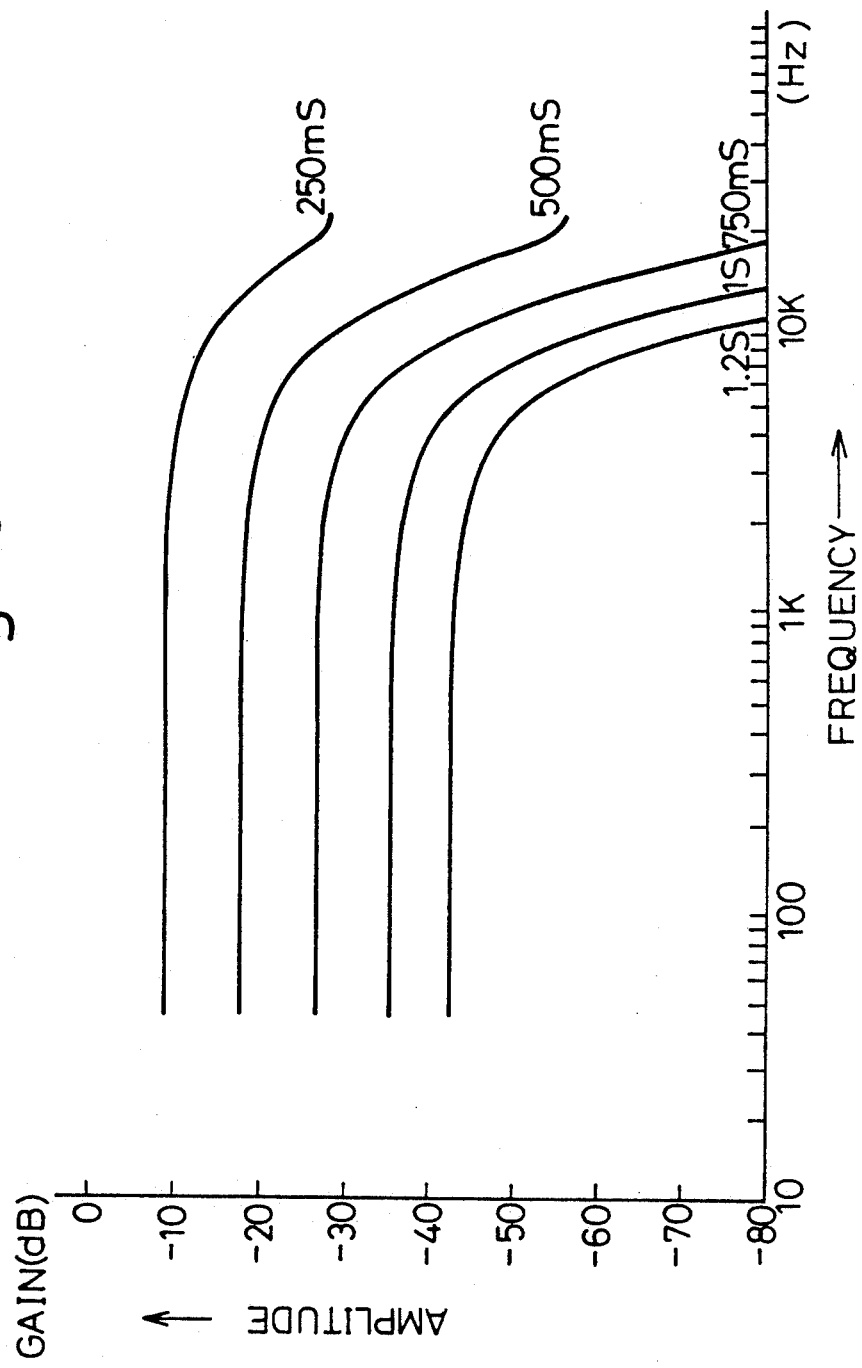
FIG. 20 is a view showing frequency characteristics of a comb filter 500-4.

Comparing the frequency characteristics of the comb filters 500-1,500-2,500-3,500-4 with each other in FIG. 18∼21, around 10 kHz in which high frequency signals are sharply reduced, each comb filter causes the rate of sharp reduction to be constant along with the elapsed time. Therefore a specified comb filter prevents sharp and rapid reduction compared with the others. Also, in a 40~5 Hz to 2 kHz flat region after the lapse of 1200 ms since inputting a signal amplitude of each comb filter has already been rendered constant at −42 dB.

Four stage comb filters may easily extend the nth stage comb filters generally.

As set forth above according to the invention, removal of high frequency components of each comb filter is performed at the same time and reverberation time thereof becomes the same so that a coefficient setting method is easier to improve reverberation sound quality and approach natural sounds.

Further, another method will be discussed hereafter in order to cause reverberation time of each comb filter to be the same and prevent reverberation density from being small in the rear part of reverberation because the reverberation sounds reproduced by said each comb filter have different periodic numbers circulated through the comb filter during the same time because of the different delay times of the first delay memories.

Figure 21:
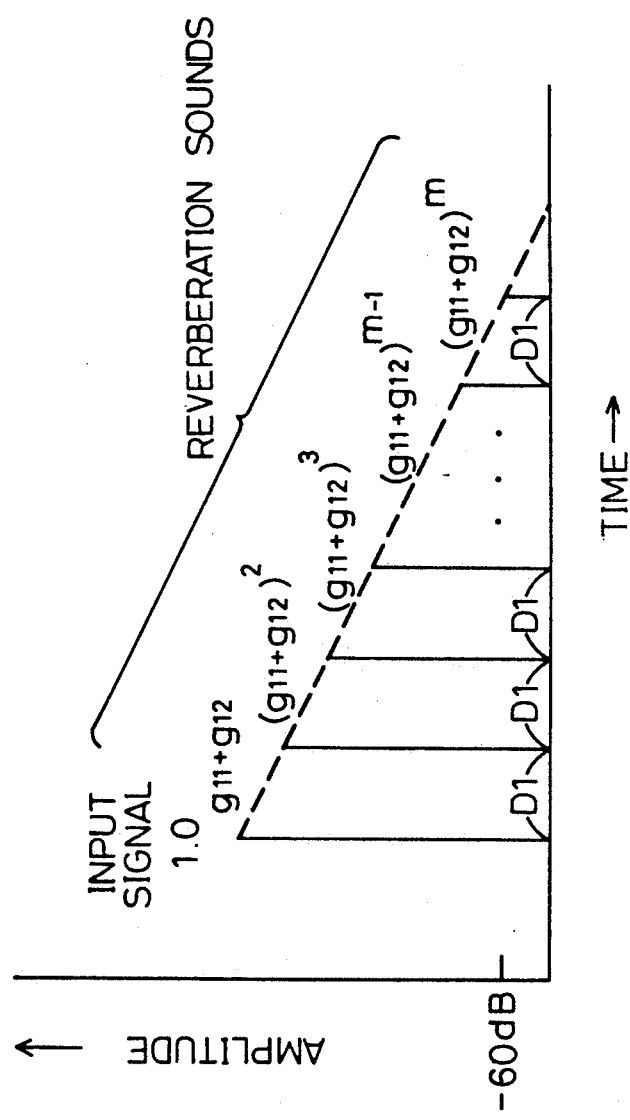
FIG. 21 is a view illustrating reverberation sound reproduction of a comb filter of FIG. 16.

FIG. 21 is a view illustrating reverberation sound reproduction of a comb filter of FIG. 15. First, the delay time T is neglected regarding the delay time $Dn$ of the first delay memories because of the relation in $D1 \gg T$. For example, a signal level inputting to the comb filter 401-1 circulates it and reduces it to $(g11+g12)^m$ after the lapse of $D1$(m times turns: constant) because of $g11+g12 < 1$. That is to say, the setting time until reducing to −60 dB as Rev, we find that $20\log(g11+g12)^m = -60$, $\text{Rev} = mD1$, $g12+g12 = -10^{-3D1/Rev}$. In the same way as the above the relation of $gn1+gn2 = 10^{-3Dn/Rev}$ as $mD1 = nDn = \text{Rev}$ (n: turn number of the comb filter 400-n) holds.

However, if each reverberation time is common in each comb filter but high frequency component removing characteristics are different, a post audio reproducing part not shown in the Figure reproduces sounds such as "ziriziri,chirichiri" because a problem arises in that in one comb filter the high frequency components have been removed but in the others they have not yet been removed.

Therefore it is necessary to render the high frequency component removing characteristics to be common. Thus, first amplitude frequency characteristics $|A(\omega)1|^m$ will be derived hereafter.

Here, $g11$ is transformed to, $$g11 = 10^{-3D1/Rev}/(g12/g11 + 1)$$
$$= 10^{-3D1/Rev}/(K1 + 1),$$
$$k1 = g12/g11.$$

Setting amplitude of the comb filter 400-1 after the laps of $mD1$ as $|A(\omega)1^m|$, we find that $$|A(\omega)1|^m = (g11^2 + (K1^2 + 2K1\cos\omega T + 1))^{m/2}$$
$$= g11^m(K1^2 + 2K1\cos\omega T + 1)^{m/2}$$
$$= (10^{-3D1/Rev}/(K1 + 1))^m(K1^2 + 2K1\cos\omega T + 1)^{m/2}.$$

In this way, in the case of giving each coefficient of the comb filter 400-1, $mD1 = pDn = \text{Rev}$, $|A(\omega)1^m| = |A(\omega)n|^P$ are set to consider the relation to the other comb filters, where $|A(\omega)n|^P$ shows amplitude of the comb filter 400-n (n=2,3, ... ). In order to make the high frequency component removing characteristics common in each comb filter, the relation of $gn1$ and $gn2$ will be derived hereafter to be $|A(\omega)1|^m = |A(\omega)n|^P$.

$$(10^{-3D1/Rev}/(K1 + 1))^m(K1^2 + 2K1\cos\omega T + 1)^{m/2} =$$
$$(10^{-3Dn/Rev}/(Kn\ 1))^p(Kn^2 + 2Kn\cos\omega T + 1)^{n/2},$$

wherein $= gn2/gn1$.

Further, the following transformation is carried out.

$$10^{-3}((K1^2 + 2K1\cos\omega T + 1)^{\frac{1}{2}}/(K1 + 1))^{Rev/D1} =$$
$$10^{-3}((Kn^2 + 2Kn\cos\omega T + 1)^{\frac{1}{2}}/(Kn + 1))^{Rev/Dn}.$$

Further, here since the design is performed with relation in $Dn = D1/2^{(n-1)/Dan}$ (Dan:parallel stage number of the comb filters), using this relation the further transformation will be carried out.

$$((K1^2 + 2K1\cos\omega T + 1)^{\frac{1}{2}}/(K1 + 1))^{c1} =$$
$$((Kn^2 + 2Kn\cos\omega T + 1)^{\frac{1}{2}}/(Kn + 1)),$$

where $c1 = 2^{(1-n)/Dan}$.

Here, setting $$((K1^2 + 2K1\cos\omega T + 1)^{\frac{1}{2}}/(K1 + 1))^{c1} = c,$$

we find that $$((Kn^2 + 2Kn\cos\omega T + 1)^{\frac{1}{2}}/(Kn + 1)) = c$$

Further arranging the above equation, we find that $$Kn^2 + 2Kn\cos\omega T + 1 = c^2(Kn^2 + 2Kn + 1),$$

thus, $$(1 - c^2)Kn^2 + 2(\cos\omega T - c^2)Kn + (1 - c^2) = 0.$$

Solving the above equation, we find that $$Kn = (-2(\cos\omega T - c^2) \pm (4(\cos\omega T - c^2)^2 - 4(1 - c^2))^{\frac{1}{2}})/2(1 - c^2)$$
$$= (-(\cos\omega T - c^2) \pm ((\cos\omega T + 1 - 2c^2)(\cos\omega T - 1))^{\frac{1}{2}})/(1 - c^2).$$

Here since $Kn$ is $0 \leq Kn \leq 1$, we find $$Kn = gn1/gn2$$
$$= ((c^2 - \cos\omega T) - ((\cos\omega T + 1 - 2c^2)(\cos\omega T - 1))^{\frac{1}{2}})/(1 - c^2).$$

Table 1 shows an example of multiplying coefficient eight stage comb filters.

TABLE 1

| | comb filter | | | |
|---|---|---|---|---|
| stage (n) | 1 | 2 | 3 | 4 |
| delay time (ms) | 80.0 | 73.4 | 67.3 | 61.7 |
| g1n + g2n | 0.871 | 0.881 | 0.890 | 0.899 |
| Kn | 0.0500 | 0.0450 | 0.0411 | 0.0371 |
| g1n | 0.830 | 0.848 | 0.855 | 0.867 |
| g2n | 0.041 | 0.038 | 0.035 | 0.032 |

| | comb filter | | | |
|---|---|---|---|---|
| stage (n) | 5 | 6 | 7 | 8 |
| delay time (ms) | 56.6 | 51.9 | 47.6 | 43.5 |

TABLE 1-continued

| | | | | |
|---|---|---|---|---|
| g1n + g2n | 0.907 | 0.914 | 0.921 | 0.927 |
| Kn | 0.0351 | 0.0312 | 0.0292 | 0.0255 |
| g1n | 0.876 | 0.886 | 0.895 | 0.904 |
| g2n | 0.031 | 0.028 | 0.026 | 0.023 |

In this table 1 the delay time D1 of the comb filter 400-1 is set to D1=80 ms, while the other delaY times are derived from the equation $Dn=D1/2^{(n-1)/Dan} 80\times 2^{(n-1)/8}$ ms. Further by setting the reverberation time Rev as Rev=4s, T=1/fs=1/22.05 kHz and $gn1+gn2=10^{-3Dn/Rev}=10^{-3Dn/4}$, Kn=gn1/gn2 is derived and, gn1 and gn2 are derived respectively. Additionally, $\omega$ is set to center designed frequency 4 kHz.

Figure 22:
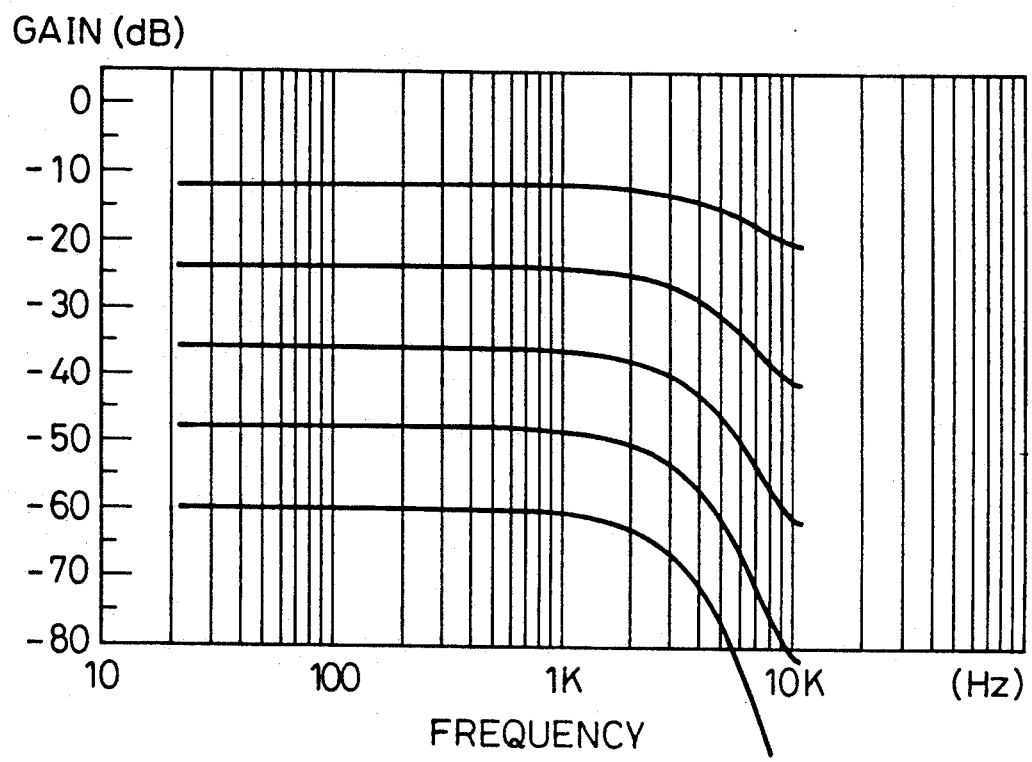
FIG. 22 is a view showing frequency characteristics of a comb filter 400-1 according to the embodiment of the invention.
Figure 23:
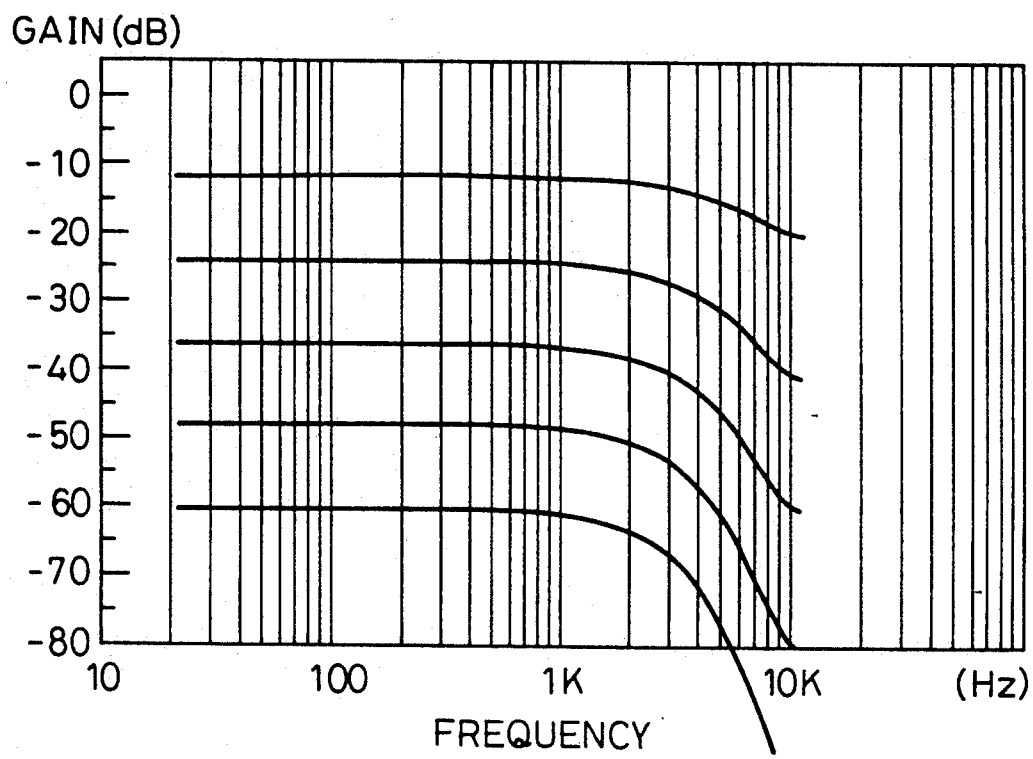
FIG. 23 is a view showing frequency characteristics of a comb filter 400-8 according to the embodiment of the invention.

FIG. 22 is a view showing frequency characteristics of a comb filter 400-1 according to the embodiment of the invention and FIG. 23 is a view showing frequency characteristics of a comb filter 400-8 according to the embodiment of the invention. Referring to FIG. 22 and FIG. 23, the number of times for feedback or circulation is adjusted so that the elapsed time since inputting to the comb filters is the same in both frequencies of the comb filter 400-1 and 400-8 to attain the expected object.

Figure 24:
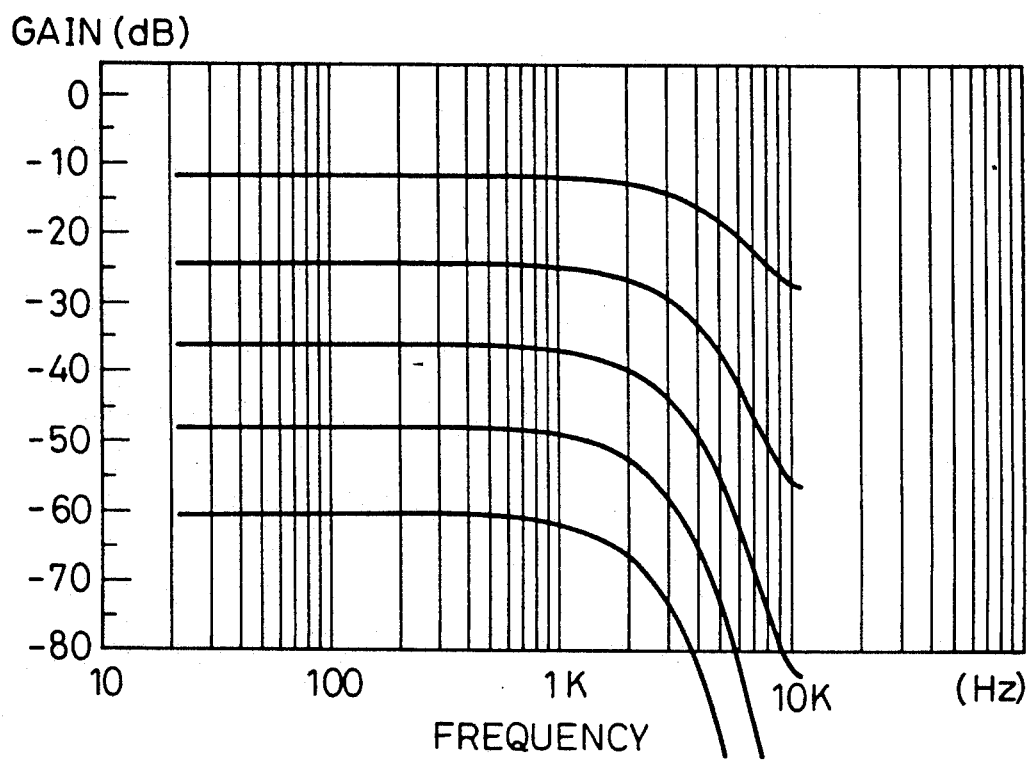
FIG. 24 is a view showing frequency characteristics of a comb filter 400-8 in the case of making the reverberation time of each comb filter common but not making the removal characteristics of high frequencies common.
Figure 25:
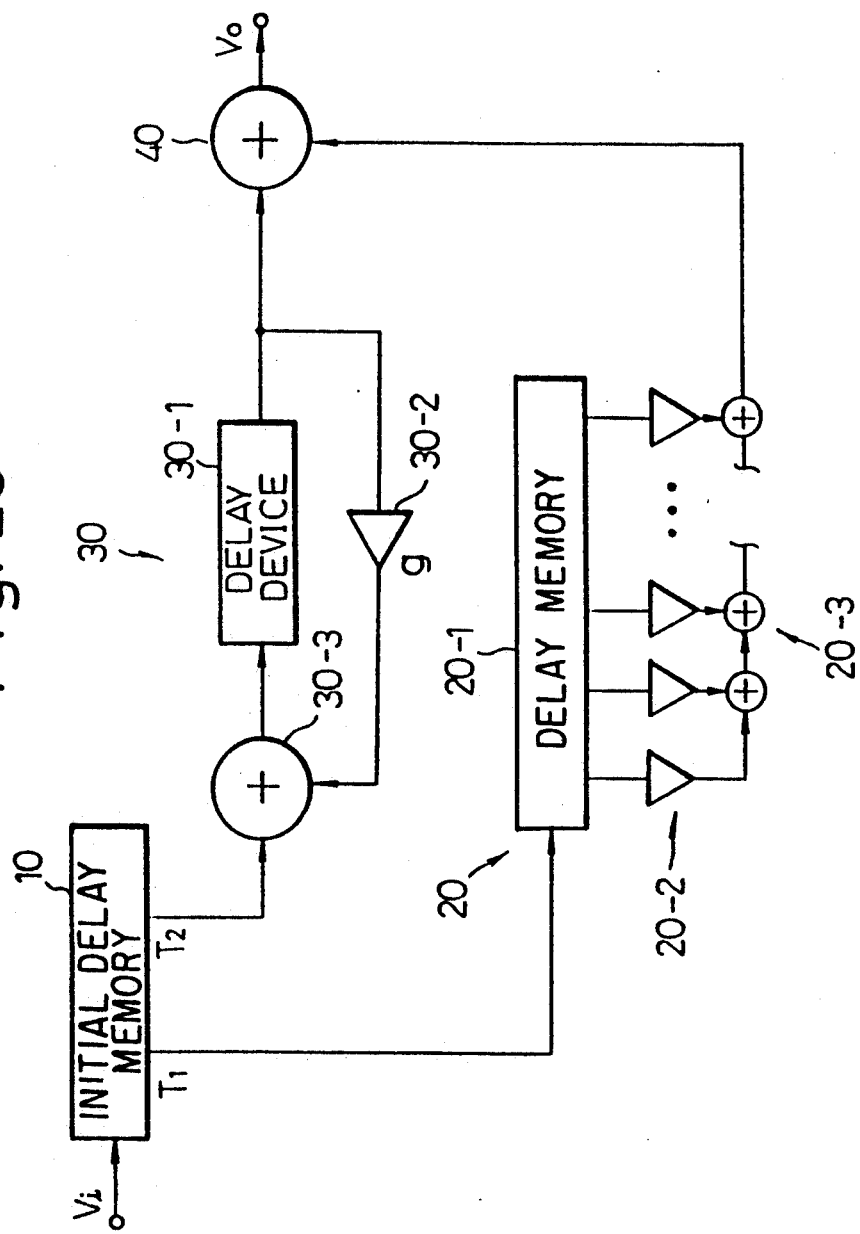
FIG. 25 is a view showing a first prior reverberation unit.
Figure 27A:
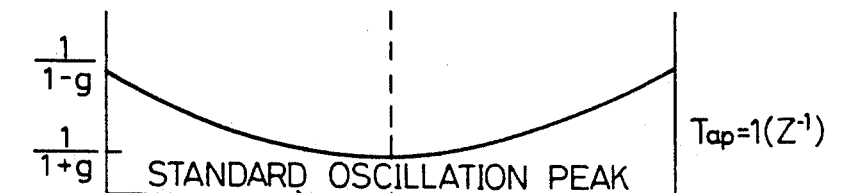
FIGS. 27(a)–27(d) are a view illustrating frequency characteristics of a prior reverberation unit.
Figure 27B:
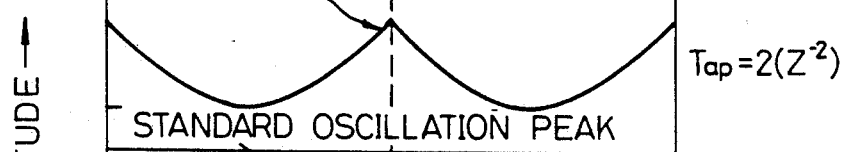
Figure 27C:
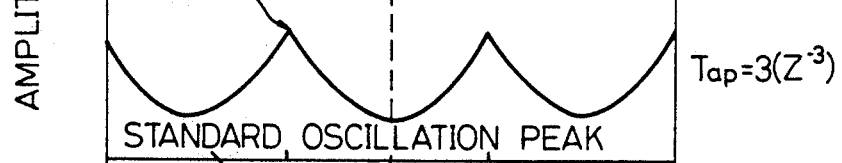
Figure 27D:
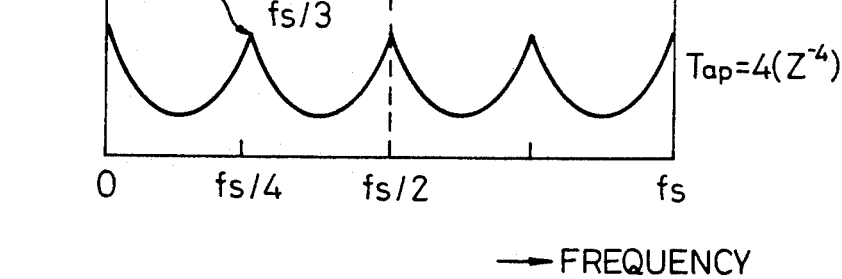
Figure 28:
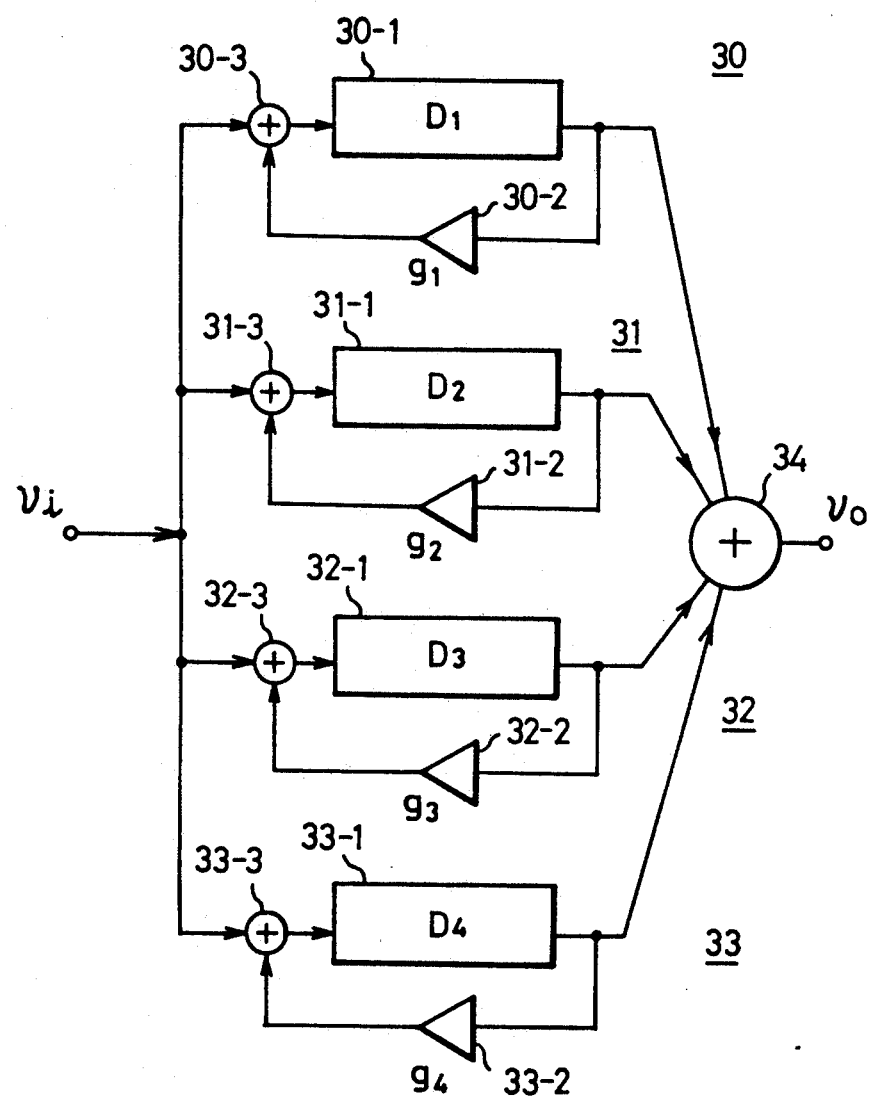
FIG. 28 is a view showing a reverberation unit including 4 stage comb filters.
Figure 29:
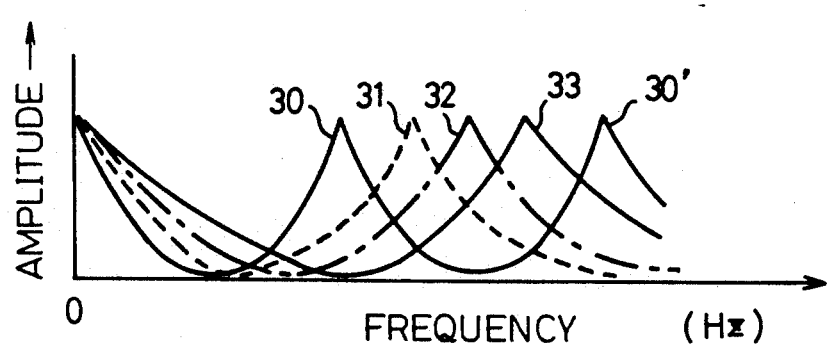
FIG. 29 is a view showing frequenciy characteristics of comb filter.
Figure 30:
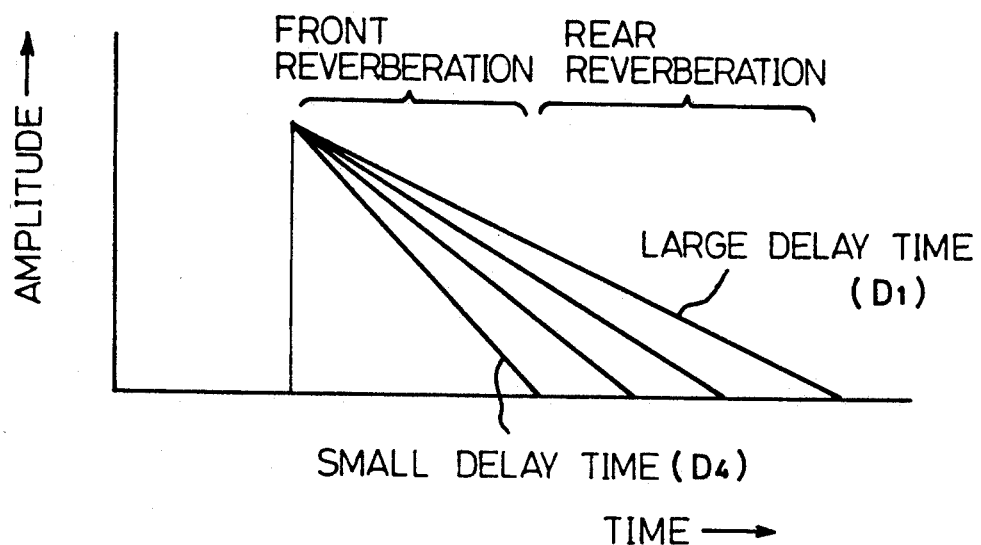
FIG. 30 is view showing envelopes of reverberation time of each comb filter.
Figure 31:
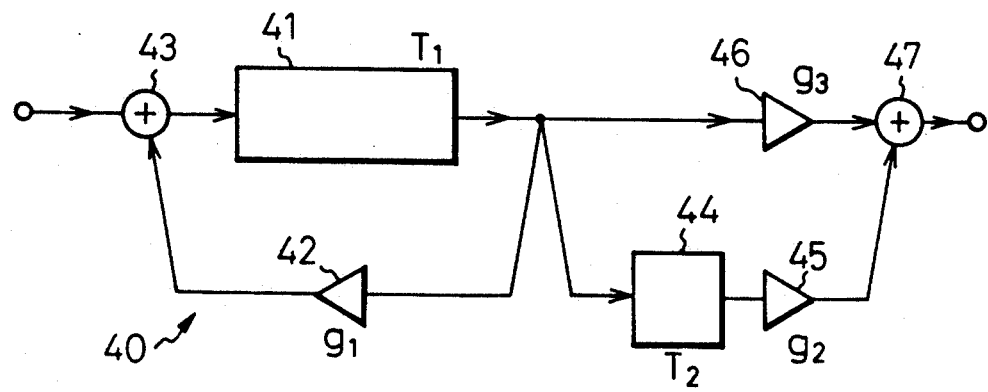
FIG. 31 is a view showing the constitution of a prior second reverberation unit.
Figure 32:
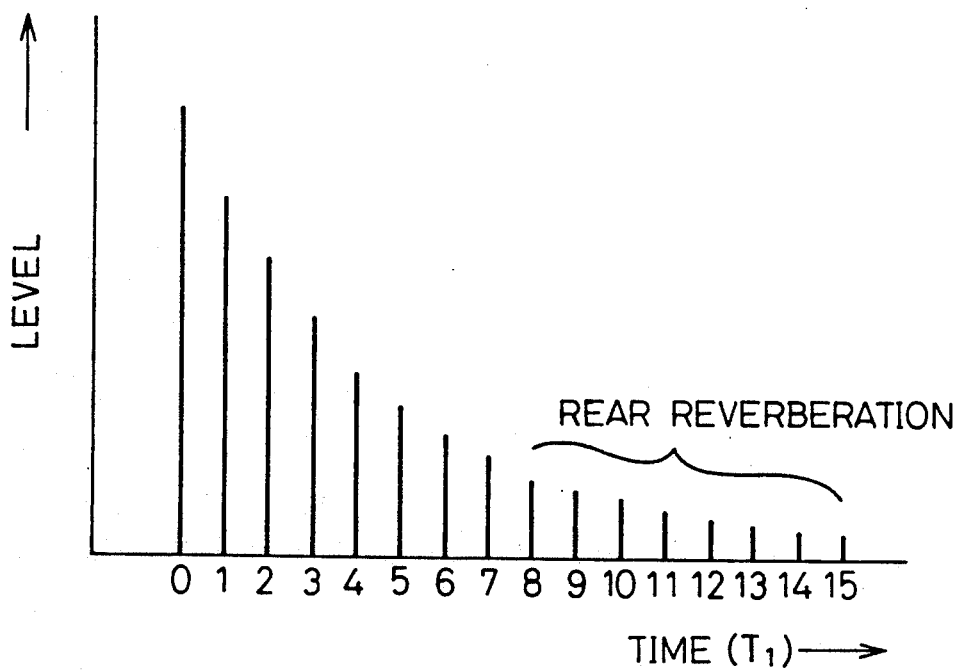
FIG. 32 is a view illustrating reverberation sound characteristics reproduced by the reverberation unit of FIG. 31.

FIG. 24 is a view showing frequency characteristics of a comb filter 400-8 in the case of making the reverberation time of each comb filter common but not making the removal characteristics of high frequencies common. Referring to FIG. 24, if the coefficients setting method according to the invention is not adopted, the difference between the comb filter 400-8 and the comb filter as shown in FIG. 23 arises so that the effect of this present invention is made clear.

As set forth above according to this invention, in a plurality of parallel connected comb filters the reverberation times and the removal characteristics of high frequencies are made to be common so that the reverberation sound quality may be improved.

I claim:

1. A coefficients setting method of a plurality of parallel connected comb filters, characterized by comprising the step of
   setting a delay time of the kth delay device provided with said n comb filters as $Tk=T1/2^{(k-1)/n}$, and
   arranging frequencies of which standard oscillation peaks of each comb filter arise, at uniform intervals on a logarithmic axis.

2. A coefficients setting method of a plurality of parallel connected comb filters characterized by comprising the step of
   setting multiplying coefficients of multipliers provided with said comb filters as $gn=10^{-3Dn/Rev}$, $Rev=-3\times D1/\log_{10}g1$, $(gn(Max)\leq 1)$ where Dn is a delay time of nth delay device provided with said each comb filter and gn is a multiplying coefficient of multipliers of said each comb filter.

3. A coefficient setting method of a plurality of parallel connected comb filters including first delay memories taking in an input signal with a predetermined sampling period respectively, first multipliers connected to outputs of the first delay memories, second delay memories connected to outputs of the first delay memories, second multipliers connected to outputs of the second delay memories, adders for adding outputs of said first multipliers and said second multipliers and said input signal with the predetermined sampling period characterized by comprising the step of
   setting delay times of the first delay memories provided with each comb filter as D1,D2, ... ,Dn,
   setting multiplying coefficients of the first multipliers provided with each comb filter as g11, g21, ..., gn1,
   setting the multiplying coefficients of the second multipliers provided with each comb filter as g12, g22, ..., gn2, and
   maintaining a relation to said coefficients and delay times for which, $gn1+gn2=10^{-3Dn/Rev}$, $(gn1+gn2\leq 1)$, $(n=1,2...,n)$ $Rev=-3D1/\log_{10}(g11,g12)$, and $g11/g12=g21/g22=...=gn1/gn2$.

4. A coefficient setting method of a plurality of parallel connected comb filters according to claim 3, comprising the step of
   setting delay times of the second delay memories provided with each comb filter as T, and
   maintaining the relation to said coefficients and delay times for which, $$gn1/gn2 = ((c^2 - \cos\omega T) - ((\cos\omega T + 1 - 2c^2)(\cos\omega T - 1))^{\frac{1}{2}})/(1 - c^2),$$

$$Rev = pDn = mD1, (n = 1, 2, \ldots, n, p, m: \text{constant}), \text{ and}$$

$$c = (((g12/g11)^2 + 2((g12/g11)\cos\omega T + 1)^{\frac{1}{2}})/(g12/g11 + 1))^{c1}$$

$$c1 = 2^{(1-n/Dan)}, (\text{Dan: stage number of the comb filters}).$$

* * * * *